(12) United States Patent
Jung

(10) Patent No.: US 8,389,405 B2
(45) Date of Patent: Mar. 5, 2013

(54) METHOD FOR FORMING FINE PATTERN HAVING VARIABLE WIDTH AND METHOD FOR MANUFACTURING SEMICONDUCTOR DEVICE USING THE SAME

(75) Inventor: Yong-ju Jung, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 324 days.

(21) Appl. No.: 12/871,023

(22) Filed: Aug. 30, 2010

(65) Prior Publication Data

US 2011/0159686 A1 Jun. 30, 2011

(30) Foreign Application Priority Data

Dec. 28, 2009 (KR) .................. 10-2009-0131836

(51) Int. Cl.
*H01L 21/44* (2006.01)
(52) U.S. Cl. ........ 438/671; 438/673; 438/702; 438/713; 438/736; 257/E21.218
(58) Field of Classification Search .................. 438/671, 438/673, 702, 713, 736
See application file for complete search history.

(56) References Cited

U.S. PATENT DOCUMENTS

| | | | |
|---|---|---|---|
| 6,087,270 A * | 7/2000 | Reinberg et al. | 438/736 |
| 6,461,774 B1 * | 10/2002 | Zimlich et al. | 430/5 |
| 7,429,536 B2 | 9/2008 | Abatchev et al. | |
| 7,749,902 B2 | 7/2010 | Kim et al. | |
| 2006/0115773 A1 * | 6/2006 | Morkved et al. | 430/320 |
| 2008/0194108 A1 | 8/2008 | Kim et al. | |

FOREIGN PATENT DOCUMENTS

| | | |
|---|---|---|
| KR | 10-2008-0017833 | 2/2008 |
| KR | 10-0825801 | 4/2008 |
| KR | 10-2009-0070686 | 7/2009 |

* cited by examiner

*Primary Examiner* — Wai Sing Louie
(74) *Attorney, Agent, or Firm* — Onello & Mello, LLP

(57) ABSTRACT

A method for forming a fine pattern having a variable width by simultaneously using an optimal focused electron beam and a defocused electron beam in a light exposure process Includes, after forming a first film on a substrate, forming a first film pattern including a first level area and a second level area having different distances from the substrate by changing a profile of an upper surface of the first film. A photoresist film having a first area covering the first level area and a second area covering the second level area is formed. To simultaneously light-expose the first area and the second area with the same width, a light exposure condition, in which an optimal focused electron beam is eradiated on the first area and a defocused electron beam is eradiated on the second area, is applied. A plurality of photoresist patterns continuously extending over the first level area and the second level area with different widths on the first level area and the second level area are formed by developing the light-exposed photoresist film.

11 Claims, 39 Drawing Sheets

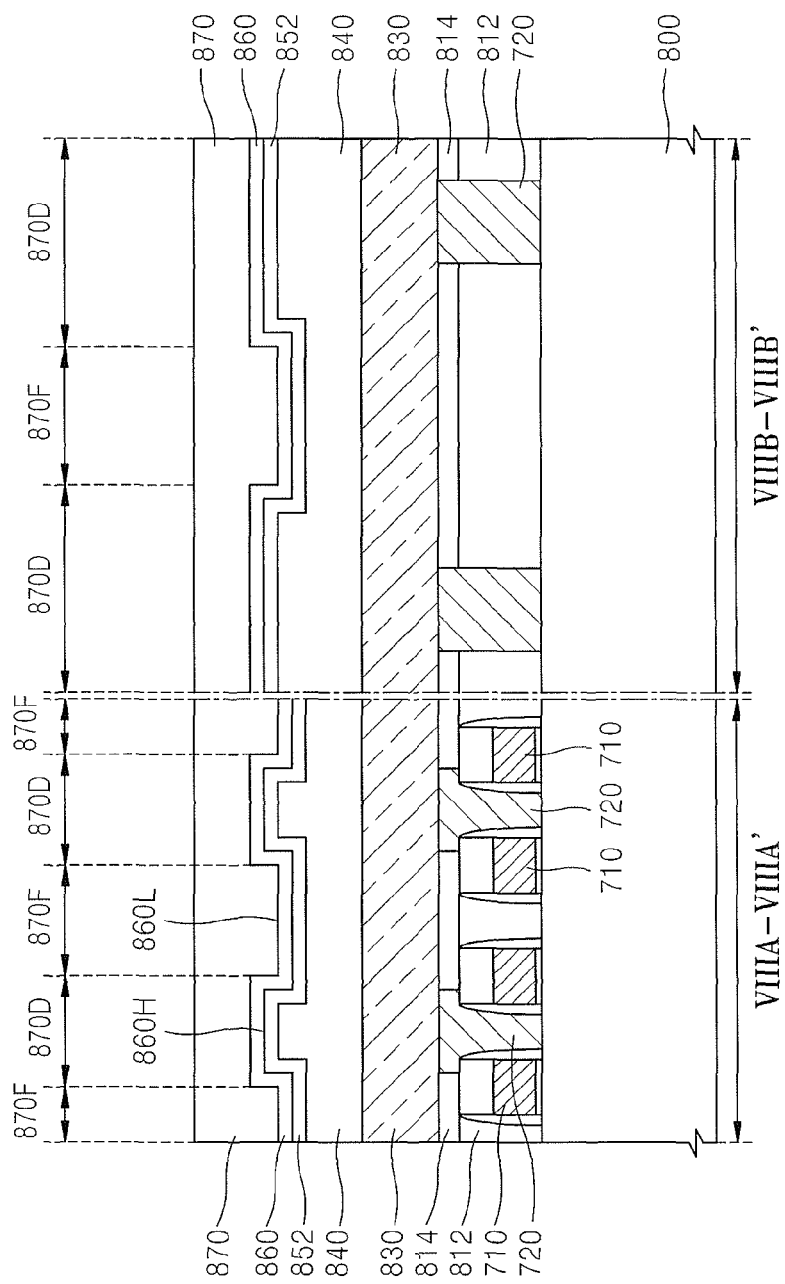

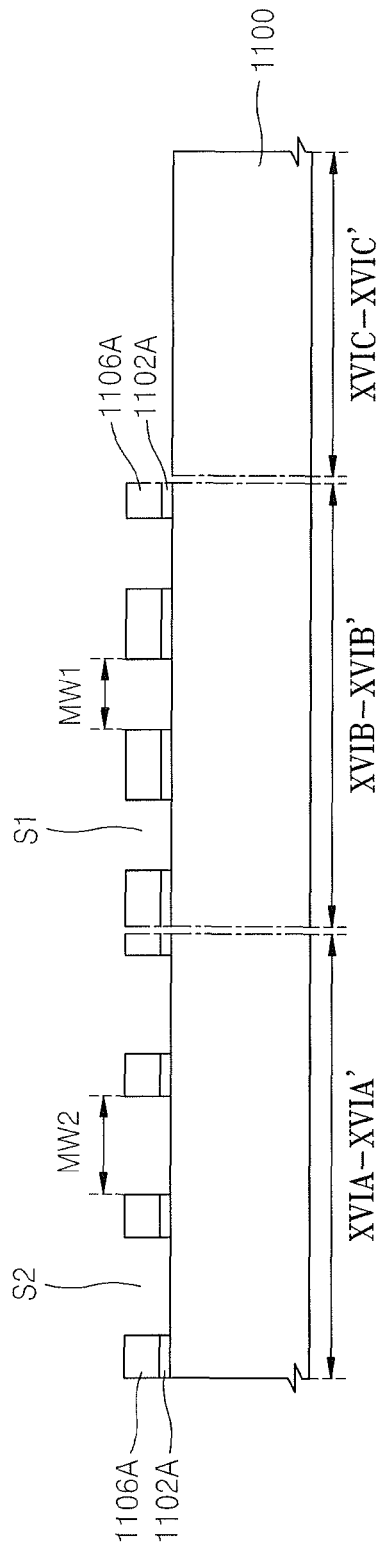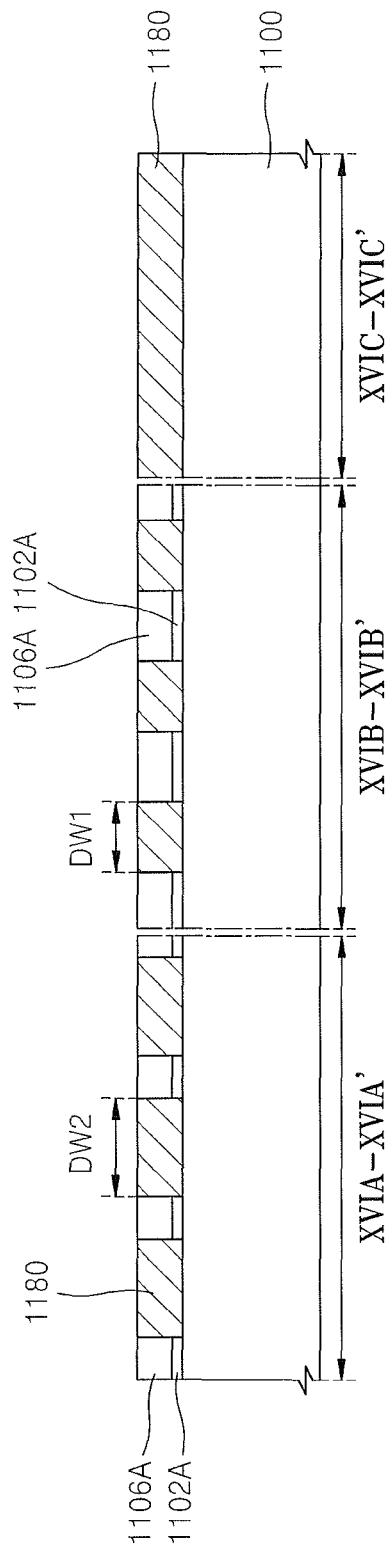

METHOD FOR FORMING FINE PATTERN HAVING VARIABLE WIDTH AND METHOD FOR MANUFACTURING SEMICONDUCTOR DEVICE USING THE SAME

CROSS-REFERENCE TO RELATED APPLICATIONS

This application claims the benefit under 35 U.S.C. 119 of Korean Patent Application No. 10-2009-0131836, filed on Dec. 28, 2009, in the Korean Intellectual Property Office, the entire content of which is incorporated herein by reference.

BACKGROUND

The inventive concept relates to a method for forming a fine pattern having a variable width in a semiconductor device and a method for manufacturing a semiconductor device having the same, and more particularly, to a method for variably forming a width of each pattern when simultaneously forming a plurality of patterns having a fine pitch and a method for manufacturing a semiconductor device using the same.

In manufacturing of highly scaled high-density semiconductor devices, when simultaneously forming a plurality of fine patterns separated from each other with a fine interval, there are situations in which some areas of the plurality of fine patterns must be formed with an increased width in comparison to other areas, depending upon the requirements of a unit device to be formed. To form a plurality of fine patterns including some areas having an increased width, a photolithography process is performed using a photo mask on which is formed a light exposure pattern corresponding to a shape to be finally formed on the device. In the photolithography process, if any of the intervals between some areas having the increased width and their neighboring fine patterns is too narrow such as to be over a resolution limit of the photolithography process, it is difficult to form a fine pattern having a desired form.

Accordingly, in situations in which a plurality of fine patterns separated from each other with a fine interval are formed to have a variable width in a length direction, a technique is needed for easily forming a fine pattern having a desired form even when the interval is too narrow such as to be over the resolution limit of the photolithography process.

SUMMARY

The inventive concept provides a method for forming a fine pattern, in which, in cases where a plurality of fine patterns separated from each other with a fine interval are formed to have a variable width in a length direction, a pattern having a desired form may be simply and easily formed, even when the interval is too narrow such as to be over a resolution limit of a photolithography process being used.

The inventive concept also provides a method for manufacturing a semiconductor device, in which, in manufacturing a semiconductor device having a unit device including a plurality of fine patterns separated from each other with a fine interval and having a variable width in a length direction, a manufacturing process of Ultra Large Scale Integration (ULSI) semiconductor devices including fine patterns may be simplified by simply and easily forming a pattern having a desired form, even when the interval between the plurality of fine patterns is too narrow such as to be over a resolution limit in a photolithography process.

According to an aspect of the inventive concept, there is provided a method for forming a fine pattern, the method including: forming a first film on a substrate; forming a first film pattern including a first level area and a second level area having different distances from the substrate by changing a profile of an upper surface of the first film; forming a photoresist film having a first area covering the first level area and a second area covering the second level area; light-exposing the photoresist film under a light exposure condition, in which an optimal focused electron beam is eradiated on the first area and a defocused electron beam is eradiated on the second area, by using a photo mask having a light exposure pattern for simultaneously light-exposing the first area and the second area with the same width; forming a plurality of photoresist patterns continuously extending over the first level area and the second level area of the first film pattern with different widths on the first level area and the second level area by developing the light-exposed photoresist film; and forming a plurality of first fine patterns having different widths on the first level area and the second level area by etching the first film pattern using the plurality of photoresist patterns as an etching mask.

The forming a first film pattern may include: forming a mask pattern covering an upper surface of the first film; forming a recess part with a bottom surface having a level lower than that of the upper surface of the first film by etching a portion of the first film from the upper surface of the first film using the mask pattern as an etching mask; and exposing an upper surface of the first film pattern by removing the mask pattern.

The bottom surface of the recess part may be disposed in the first level area, and the upper surface of the first film pattern may be disposed in the second level area. Alternatively, the bottom surface of the recess part may be disposed in the second level area, and the upper surface of the first film pattern may be disposed in the first level area.

The method may further include forming a second film having an upper surface with a floor level difference on the first film pattern before forming the photoresist film and after forming the first film pattern. In this case, the photoresist patterns may be formed on the second film. The second film may be a single film or a multiple film in which a plurality of films are layered in order.

In the method, a plurality of first level areas may be included on the upper surface of the first film pattern. The first level area may have a planar structure of a form of a plurality of lines extending parallel to each other.

Alternatively, a plurality of first level areas may be included on the upper surface of the first film pattern. Each of the plurality of first level areas may have a planar structure of one of a circle, an ellipse, and a polygon.

The substrate may include a first member layer exposed on an upper surface thereof. The method may include forming a first member pattern having a variable width in a length direction by etching the first member layer using the first fine pattern as an etching mask after forming the first fine pattern. The first member layer may be an insulation film or a conductive film.

According to another aspect of the inventive concept, there is provided a method for manufacturing a semiconductor device, the method including: forming a conductive layer on a substrate; forming a hard mask layer on the conductive layer; changing a profile of an upper surface of the hard mask layer so that a first level area and a second level area having different distances from the substrate are included on an upper surface of the hard mask layer; forming a photoresist film having a first area covering the first level area of the hard mask layer and a second area covering the second level area of the hard mask layer on the hard mask layer; light-exposing the photoresist film under a light exposure condition, in which an optimal focused electron beam is eradiated on the first area and a defocused electron beam is eradiated on the second area, by using a photo mask having a light exposure pattern for simultaneously light-exposing the first area and the second area with the same width; forming a plurality of photoresist patterns continuously extending over the first level area and the second level area of the hard mask layer with different widths on the first level area and the second level area by developing the light-exposed photoresist film; forming a plurality of hard mask patterns having different widths on the first level area and the second level area by etching the hard mask layer using the plurality of photoresist patterns as an etching mask; and forming a plurality of conductive patterns having a variable width in a length direction by etching the conductive layer using the plurality of hard mask patterns as an etching mask.

On the substrate, the first level area of the hard mask layer may have a level lower than that of the second level area of the hard mask layer.

In the light-exposing the photoresist film, the light exposure pattern of the photo mask may include a light-projecting area having a form of a plurality of lines extending in the same direction with a constant width and a light-shielding film pattern having a form of a plurality of lines limiting the light-projecting area.

The substrate may include a conductive area, and the plurality of conductive patterns may include a plurality of contact areas contacting the conductive area. Each of the plurality of contact areas included in the plurality of conductive patterns may have a width wider than those of the other parts of the plurality of conductive patterns. Each of the plurality of conductive patterns may constitute a bit line of a semiconductor device.

Alternatively, the substrate may include an isolation area and an active area defined by the isolation area, the plurality of conductive patterns may continuously extend over the active area and the isolation area on the active area and the isolation area, and a part disposed on a boundary between the active area and the isolation area of the substrate out of the plurality of conductive patterns may have a width wider than those of the other parts of the plurality of conductive patterns. Each of the plurality of conductive patterns may constitute a word line of a semiconductor device.

According to another aspect of the inventive concept, there is provided a method for manufacturing a semiconductor device, the method including: forming a mold layer on a substrate; forming a first film on the mold layer; forming a first film pattern including a first level area and a second level area having different distances from the substrate by changing a profile of an upper surface of the first film; forming a photoresist film having a first area covering the first level area and a second area covering the second level area on the first film pattern; light-exposing the photoresist film under a light exposure condition, in which an optimal focused electron beam is eradiated on the first area and a defocused electron beam is eradiated on the second area, by using a photo mask having a light exposure pattern for simultaneously light-exposing the first area and the second area with the same width; forming a plurality of photoresist patterns continuously extending over the first level area and the second level area of the first film pattern with different widths on the first level area and the second level area by developing the light-exposed photoresist film; forming a plurality of first fine patterns having different widths on the first level area and the second level area by etching the first film pattern using the plurality of photoresist patterns as an etching mask; forming a plurality of mold patterns separated from each other with a plurality of spaces by etching the mold layer using the plurality of first fine patterns as an etching mask; and forming a plurality of wiring patterns in the plurality of spaces.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept. In the drawings, the thickness of layers and regions may be exaggerated for clarity.

FIGS. 8A to 8H are sectional views illustrated in accordance with a sequence of process steps to illustrate the method for forming a fine pattern according to the third exemplary embodiment of the inventive concept.

FIGS. 16A to 16J are sectional views illustrated in accordance with a sequence of process steps to illustrate the method for forming a fine pattern according to the fifth exemplary embodiment of the inventive concept.

DETAILED DESCRIPTION OF THE EMBODIMENTS

Figure 1A:
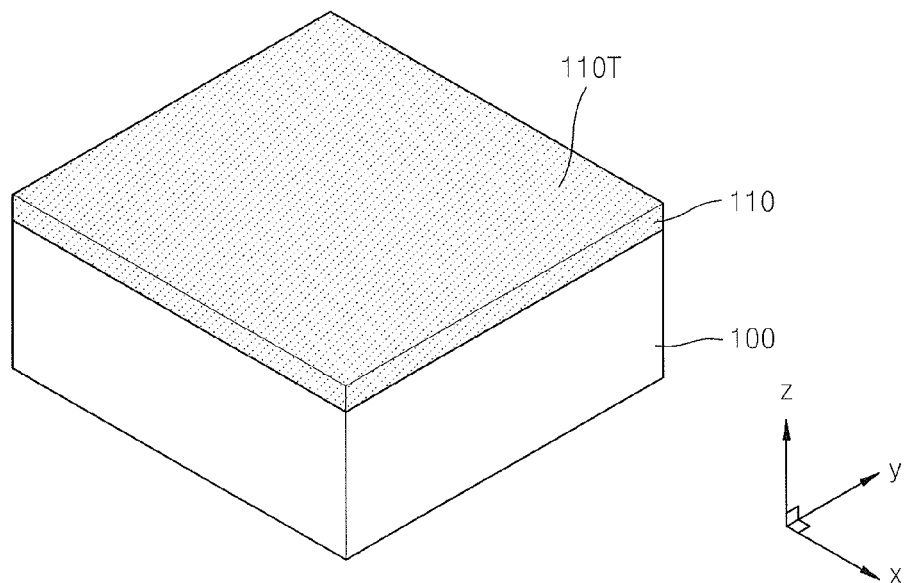
FIGS. 1A to 1H are partial perspective views illustrated in accordance with a sequence of process steps, to illustrate a method for forming a fine pattern according to a first exemplary embodiment of the inventive concept.

The inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this description will be thorough and complete, and will fully convey the inventive concept to those skilled in the art. It will be understood that when a layer is referred to as being "on" another layer or substrate, it may be directly on the other layer or substrate, or intervening layers may also be present. Various elements and areas in the drawings are schematically drawn. Therefore, the inventive concept is not limited by a relative size or interval drawn on the drawings.

FIGS. 1A to 1H are partial perspective views illustrated in accordance with a sequence of process steps to illustrate a method for forming a fine pattern according to a first exemplary embodiment of the inventive concept.

Referring to FIG. 1A, a first film 110 is formed on a substrate 100.

The substrate 100 may be formed of materials used to fabricate a semiconductor device. For example, the substrate 100 may be a silicon substrate. Alternatively, the substrate 100 may have a structure including a silicon substrate and unit devices needed to fabricate a semiconductor device, such as a transistor, a wiring layer, and an insulation film, on the silicon substrate.

The first film 110 may have a flat upper surface 110T. The first film 110 may include various materials depending upon the type of pattern to be realized using the first film 110. For example, the first film 110 may be an insulation film or a conductive film.

Figure 1B:
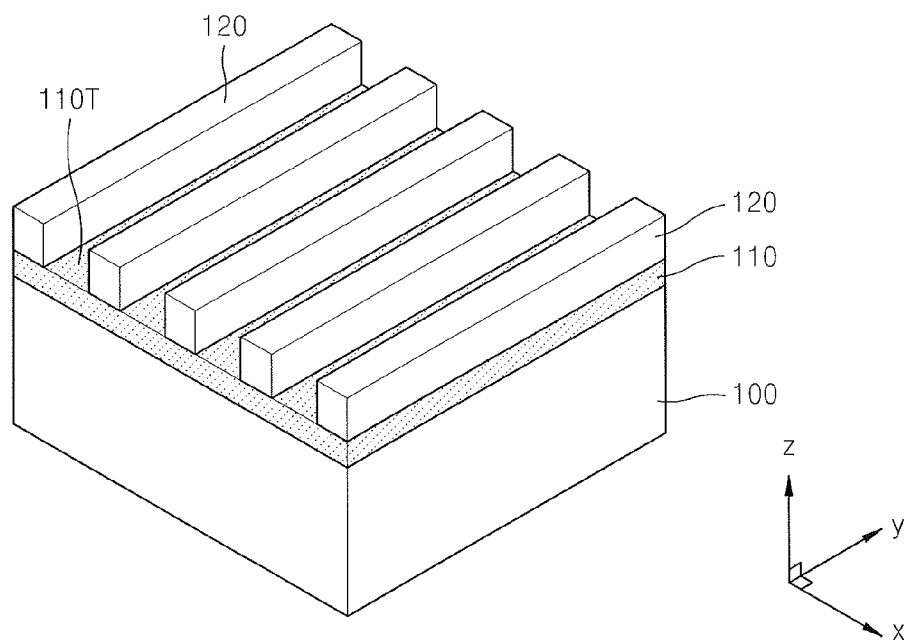
Figure 1C:
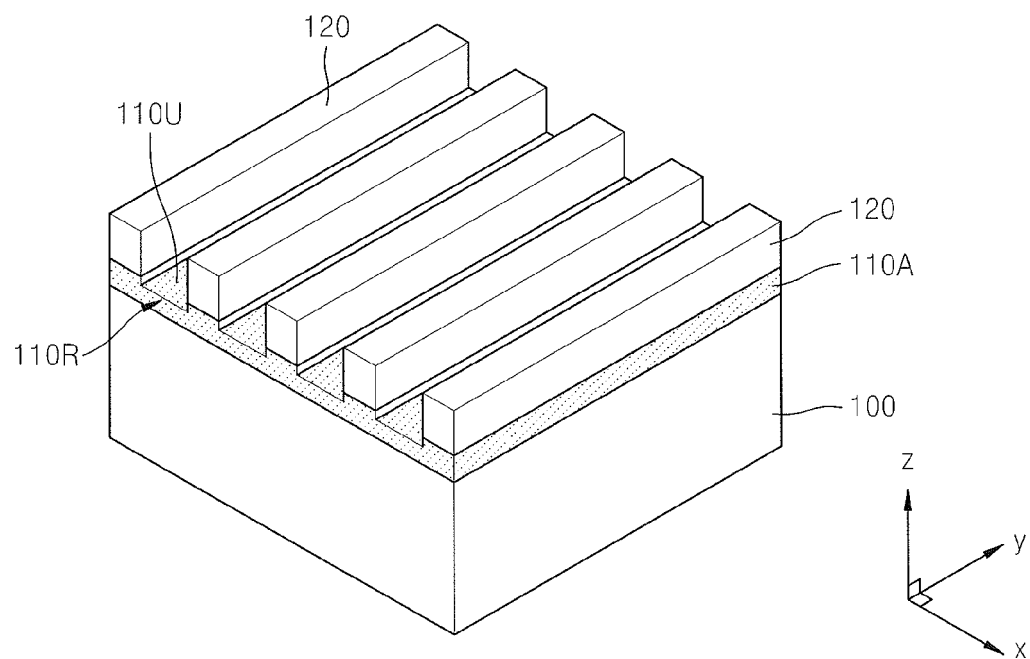

Referring to FIG. 1B, a mask pattern 120 is formed on the first film 110. FIG. 1C illustrates a situation in which the mask pattern 120 includes a plurality of line patterns extending in a first direction, e.g., the y direction in FIG. 1B). However, the mask pattern 120 may have various shapes. The mask pattern will be described below in more detail with reference to FIGS. 6A and 6B. A portion of the upper surface 110T of the first film 110 is exposed through the mask pattern 120.

The mask pattern 120 may include materials having a different etching selectivity ratio from that of the first film 110. For example, the mask pattern 120 may be a photoresist. Alternatively, the mask pattern 120 may be a hard mask pattern including an oxide, a nitride, or a combination of them.

Referring to FIG. 1C, a recess part 110R having a bottom surface 110U at a level lower than that of the upper surface 110T of the first film 110 is formed by etching a portion of the first film 110 from the exposed upper surface 110T of the first film 110 using the mask pattern 120 as an etching mask.

Figure 1D:
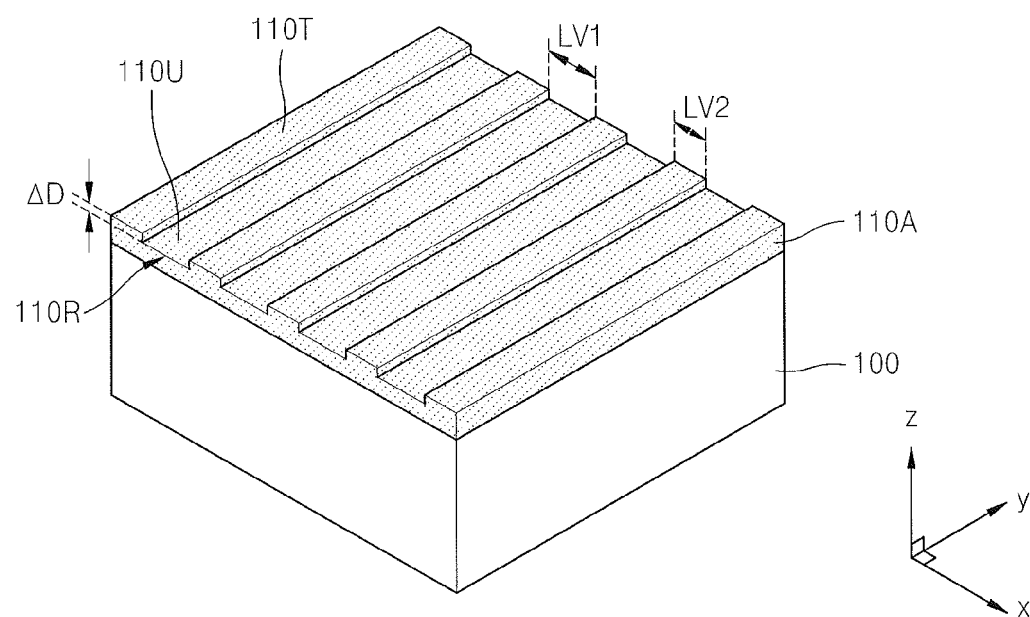

Referring to FIG. 1D, the upper surface 110T of a first film pattern 110A is exposed by removing the mask pattern 120.

By forming the recess part 110R on the first film 110, a profile of the upper surface 110T of the first film 110 is changed, resulting in forming an uneven shaped topology including a first level area LV1 and a second level area LV2 having different distances from an upper surface of the substrate 100 on the first film pattern 110A. In the current embodiment, the first level area LV1 may be an area in which the recess part 110R of the first film pattern 110A is disposed. The second level area LV2 may be an area other than the recess part 110R of the first film pattern 110A, i.e., an area in which the upper surface 110T is disposed.

A distance from the upper surface of the substrate 100 to a bottom surface 110U of the recess part 110R is shorter than a distance from the upper surface of the substrate 100 to the upper surface 110T of the first film pattern 110A. A distance difference ΔD between the upper surface 110T of the first film pattern 110A and the bottom surface 110U of the recess part 110R may be predetermined as desired.

Figure 1E:
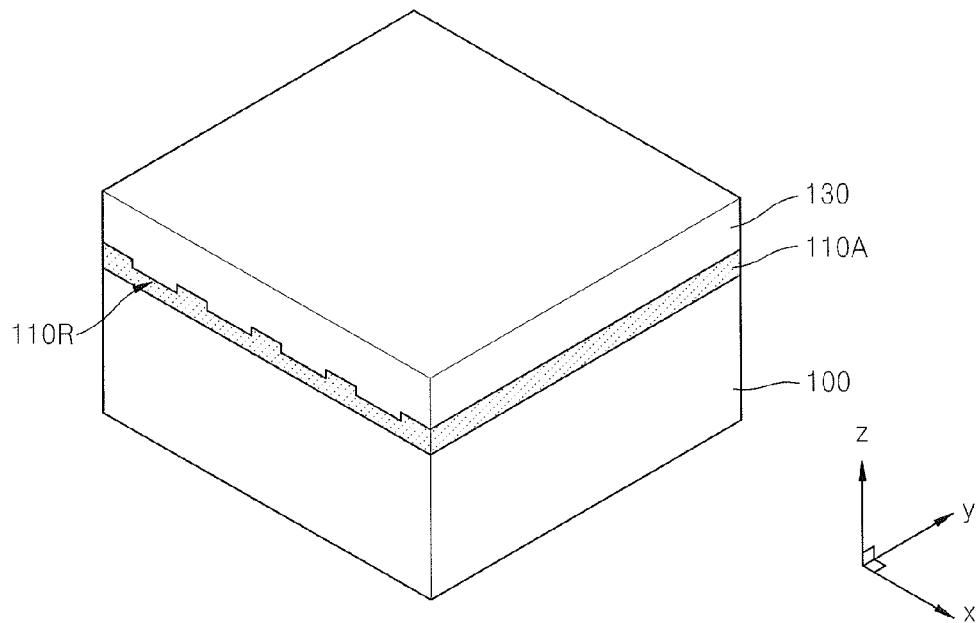

Referring to FIG. 1E, a photoresist film 130 is formed on the first film pattern 110A.

In the current embodiment, there is illustrated a case in which the photoresist film 130 includes positive photoresist materials. However, the inventive concept is not limited to this, and negative photoresist materials may be used.

Figure 1F:
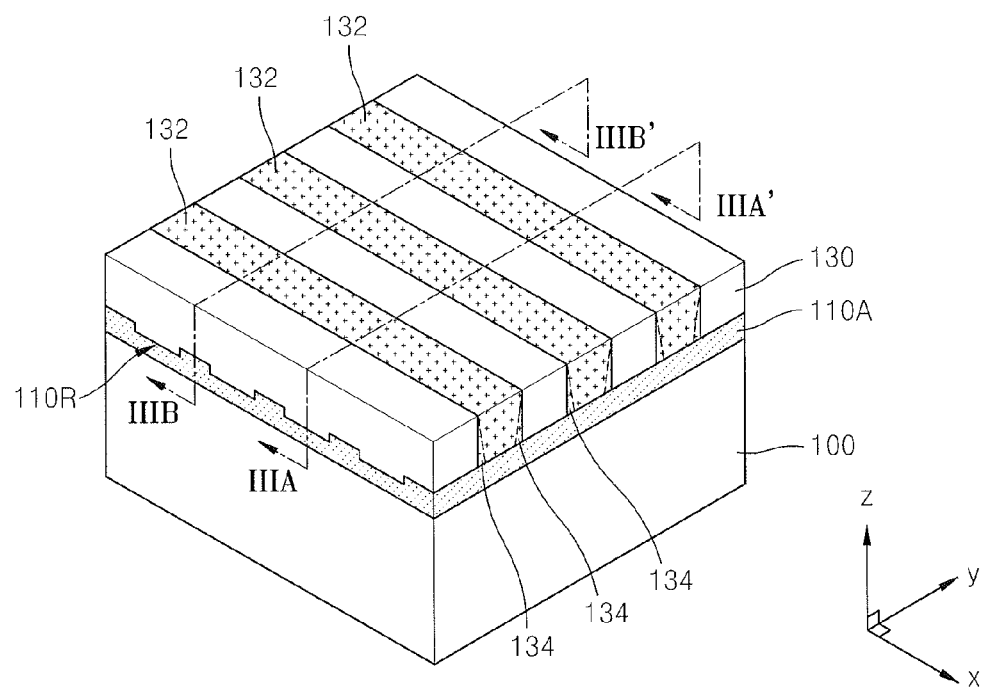

Referring to FIG. 1F, using a photo mask having a predetermined light exposure pattern, a portion of the photoresist film 130 is exposed to a light source.

Figure 2:
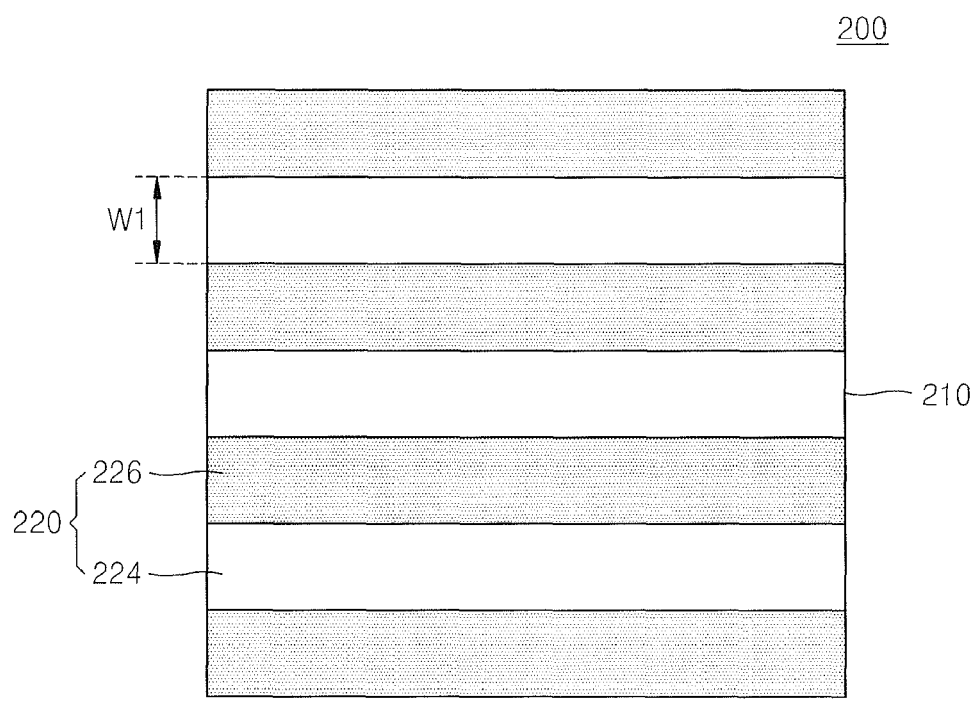
FIG. 2 is a partial top view illustrating a photo mask on which a light exposure pattern applicable in a light exposure process is formed in the method for forming a fine pattern according to the first exemplary embodiment of the inventive concept.

FIG. 2 is a partial top view illustrating a photo mask 200 on which a light exposure pattern 220 according to an embodiment applicable in a light exposure process is formed, with reference to FIG. 1F.

In the photo mask 200 illustrated in FIG. 2, the light exposure pattern 220 may include a light-projecting area 224 having a form of a plurality of lines extending in the same direction with a constant width W1 on a transparent substrate 210 and a light-shielding film pattern 226 having a form of a plurality of lines limiting the light-projecting area 224.

FIG. 1F shows light exposure areas 132 on the photoresist film 130 in a case of exposing the photoresist film 130 to a light source by means of a light exposure process using the photo mask 200 illustrated in FIG. 2.

As illustrated in FIG. 1F, the plurality of light exposure areas 132 on the photoresist film 130 may extend in a direction, e.g., the x direction in FIG. 1F, orthogonal to an extended direction (y direction in FIG. 1F) of the recess part 110R. Thus, the plurality of light exposure areas 132 on the photoresist film 130 may be designed to simultaneously include the first level area LV1 in which the recess part 110R is formed and the second level area LV2 in which the recess part 110R is not formed. For a light exposure condition of the photoresist film 130, a light exposure condition in which an optimal focused electron beam is eradiated on the first level area LV1 and a defocused electron beam is eradiated on the second level area LV2 is applied. To do this, an optimal focus position in light exposure of the photoresist film 130 may be set to the bottom surface 110U of the recess part 110R. By doing this, an optimal focused electron beam may be eradiated on the first level area LV1, and a defocused electron beam may be eradiated on the second level area LV2 having the upper surface 110T of a level higher than that of the bottom surface 110U of the recess part 110R.

Figure 3A:
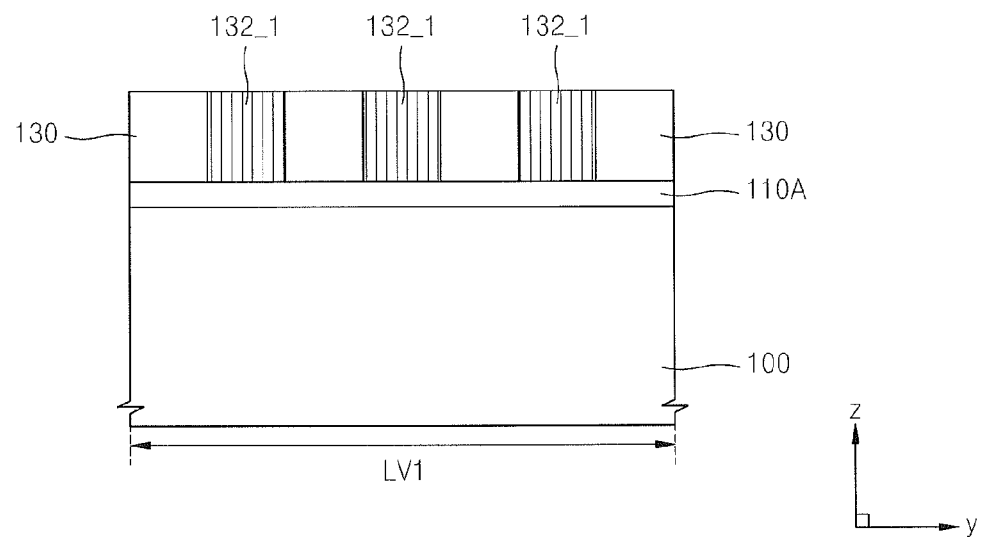
FIGS. 3A and 3B are sectional views illustrating an incident area of an electron beam in a partial area of a photoresist film on which an optimal focused electron beam is eradiated and a partial area of a photoresist film on which a defocused electron beam is eradiated in light exposure in the method for forming a fine pattern according to the first exemplary embodiment of the inventive concept.
Figure 3B:
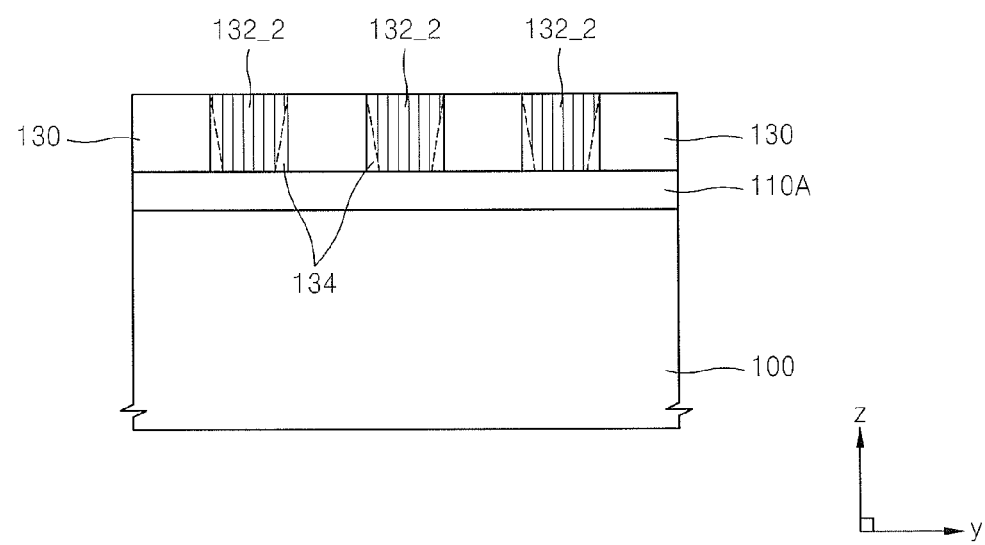

FIGS. 3A and 3B are sectional views illustrating an incident area of an electron beam eradiated in a light exposure process, taken along cut lines IIIA-IIIA' and IIIB-IIIB' of FIG. 1F, respectively.

FIG. 3A schematically shows a section profile of an area on which an electron beam is incident in the first level area LV1 out of the light exposure areas 132 of the photoresist film 130 after the light exposure process described with reference to FIG. 1F. FIG. 3B schematically shows a section profile of an area on which an electron beam is incident in the second level area LV2 out of the light exposure areas 132 of the photoresist film 130 after the light exposure process described with reference to FIG. 1F.

In an area on which an optimal focused electron beam is eradiated out of the light exposure areas 132 of the photoresist film 130, i.e., first areas 132-1 disposed on the first level area LV1 having the recess part 110R, the electron beam in light exposure is evenly eradiated up to the bottom of the photoresist film 130 all over the light exposure areas 132. However, in second areas 132-2 disposed on the second level area LV2 on which a defocused electron beam is eradiated out of the light exposure areas 132 of the photoresist film 130, the electron beam in light exposure is not evenly incident in the light exposure areas 132 due to a relatively poor focus, and the closer from the top of the photoresist film 130 to the bottom thereof, the more areas 134 on which the electron beam is not eradiated in parts adjacent to non-light exposure areas exist. The areas 134 on which the electron beam is not eradiated may be areas under slopes represented with dotted lines in FIG. 3B.

Figure 1G:
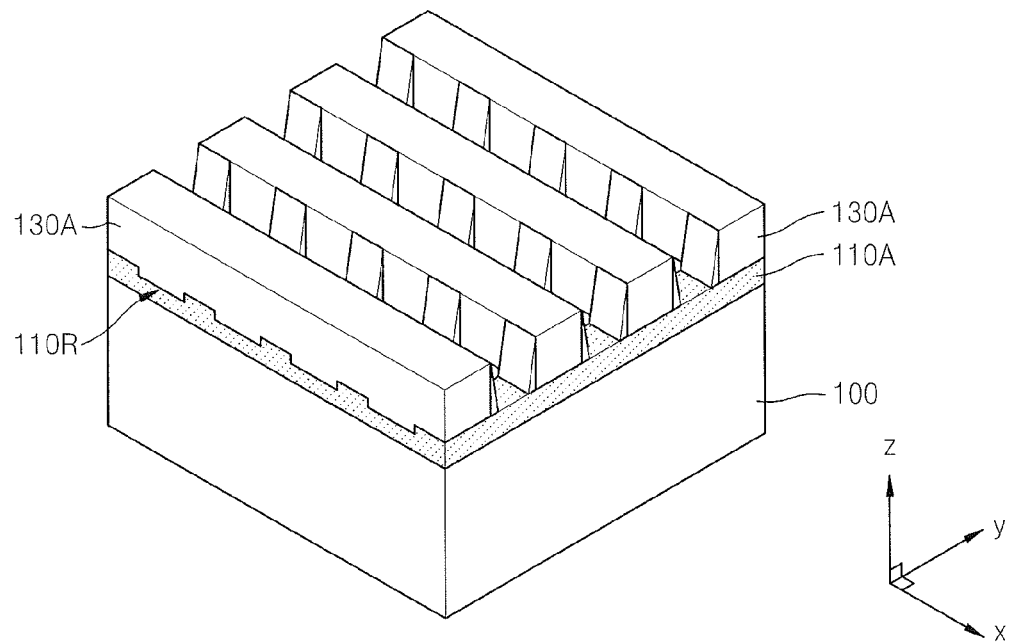

Referring to FIG. 1G, a photoresist line pattern 130A is formed by developing the light-exposed photoresist film 130.

Figure 4:
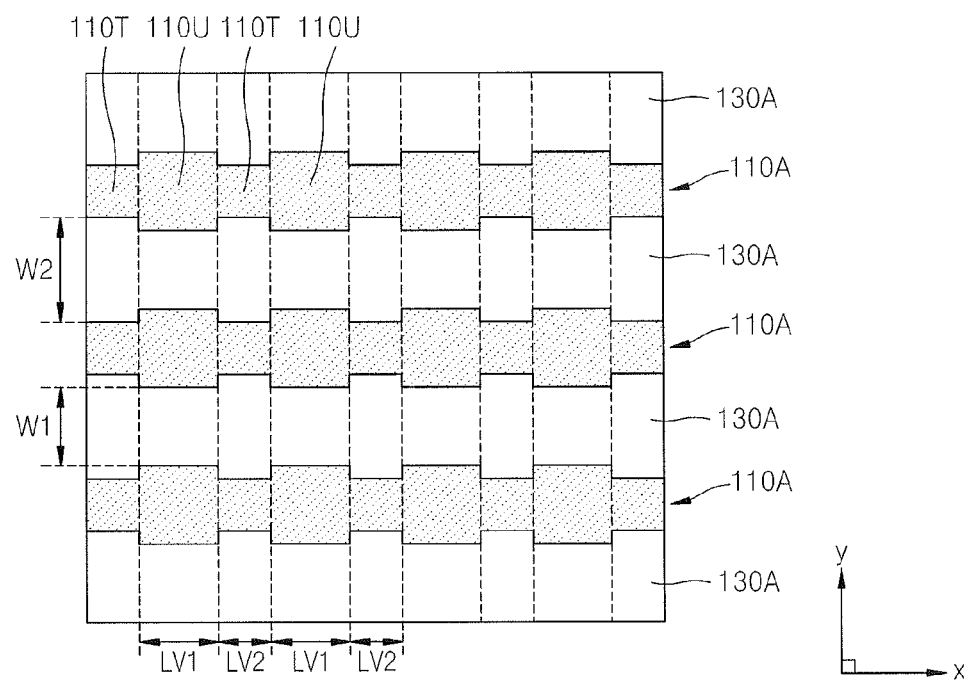
FIG. 4 is a top view illustrating a photoresist line pattern obtained after developing a photoresist film including an area on which an optimal focused electron beam is eradiated and an area on which a defocused electron beam is eradiated in light exposure and a first film pattern exposed through the photoresist line pattern in the method for forming a fine pattern according to the first exemplary embodiment of the inventive concept.

FIG. 4 is a top view showing the photoresist line pattern 130A obtained after performing a process of FIG. 1G and the first film pattern 110A exposed through the photoresist line pattern 130A.

As illustrated in FIG. 4, the photoresist line pattern 130A includes a plurality of line patterns extending over the first level area LV1 and the second level area LV2 and having a first width W1 on an upper surface of the first level area LV1 and a second width W2 wider than the first width W1 on an upper surface of the second level area LV2.

Figure 1H:
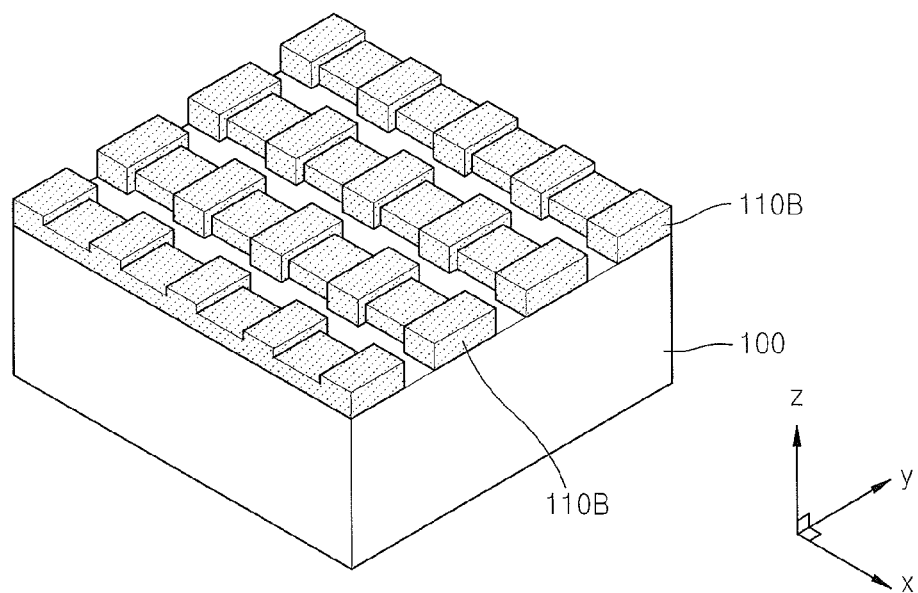

Referring to FIG. 1H, a plurality of first fine patterns 110B are formed by etching the first film pattern 110A using the photoresist line pattern 130A as an etching mask. Thereafter, the photoresist line pattern 130A is removed.

Figure 5:
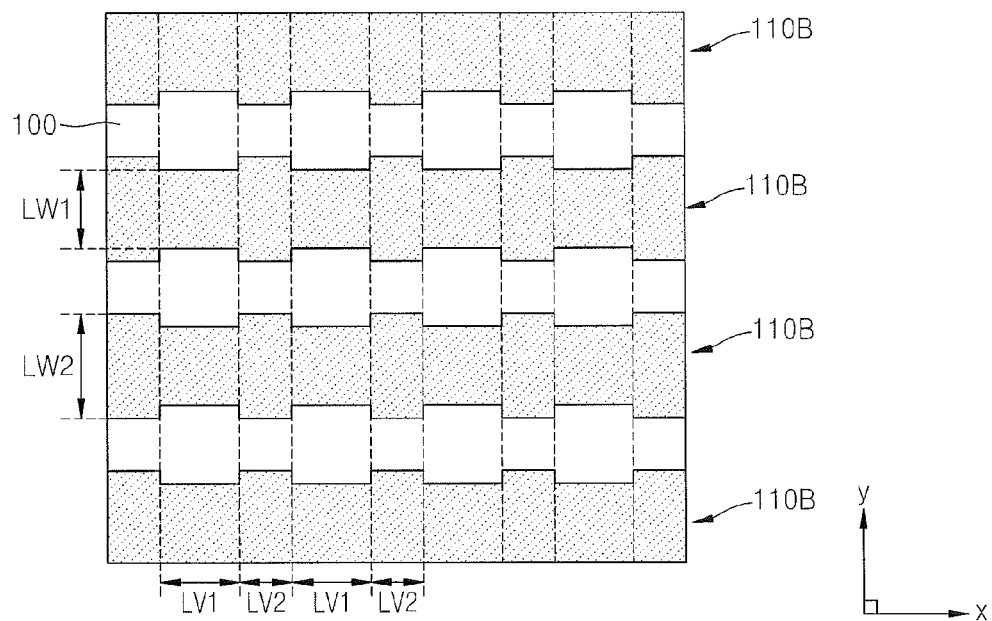
FIG. 5 is a top view illustrating a plurality of first fine patterns formed by the method for forming a fine pattern according to the first exemplary embodiment of the inventive concept.

FIG. 5 is a top view showing the plurality of first fine patterns 110B obtained after performing a process of FIG. 1H.

As illustrated in FIG. 5, the plurality of first fine patterns 110B has a variable width in a length direction (x direction in FIGS. 1H and 5) by having a first width LW1 in a y direction in the first level area LV1 and having a second width LW2 wider than the first width LW1 in the y direction in the second level area LV2.

In the method for forming a fine pattern according to the first exemplary embodiment of the inventive concept described with reference to FIGS. 1A to 5, there is illustrated a situation in which the bottom surface 110U of the recess part 110R formed on the first film patter 110A in the first level area LV1 has a planar structure of a form of lines extending in the y direction. However, the inventive concept is not limited to this. For example, the bottom surface 110U of the recess part 110R formed in the first level area LV1 may have an arbitrary plane form, such as a circle, ellipse, or polygon. To do this, a recess part of a desired form may be formed on the first film 110 by forming a mask pattern having a pattern of the desired form instead of the mask pattern 120 as a mask pattern to be used as an etching mask on the first film 110.

Figure 6A:
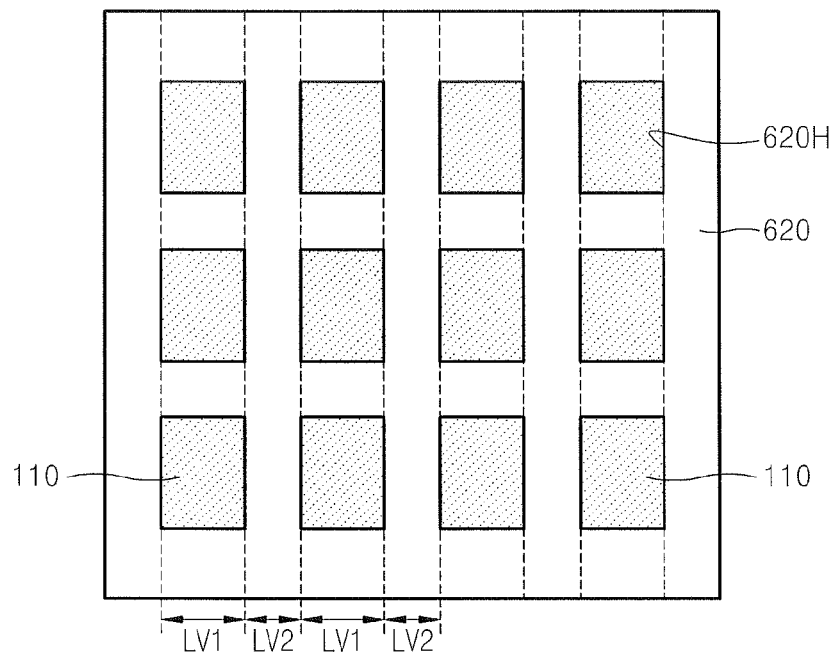
FIGS. 6A and 6B are top views illustrating a method for forming a fine pattern according to a second exemplary embodiment of the inventive concept.
Figure 6B:
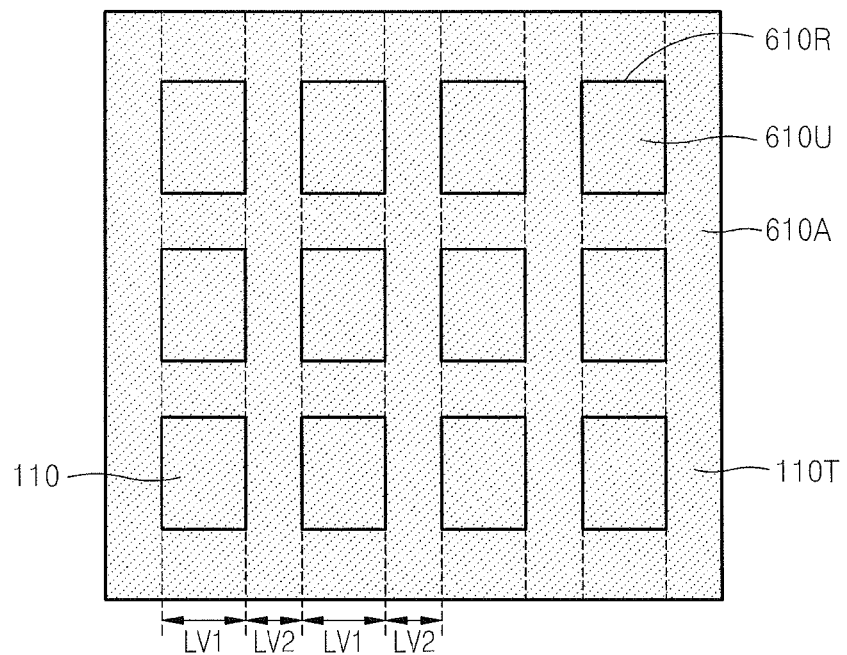

FIGS. 6A and 6B are top views illustrating a case of forming a recess part of which a plane form is a rectangle on the first film 110 according to a sequence of process steps in accordance with a method for forming a fine pattern according to a second exemplary embodiment of the inventive concept.

In FIGS. 6A and 6B, like reference numerals in the first embodiment described with reference to FIGS. 1A to 5 denote like elements.

Referring to FIG. 6A, a mask pattern 620 having an opening 620H of which a plane form is a rectangle is formed on the upper surface 110T of the first film 110 formed by the same method as described with reference to FIG. 1A. The opening 620H of the mask pattern 620 is formed to expose the first level area LV1 of the first film 110.

Referring to FIG. 6B, a first film pattern 610A, on which a recess part 610R having a rectangular plane form is formed, is formed by etching a portion of the total thickness of the exposed first film 110 using the mask pattern 620 as an etching mask.

A distance difference (corresponding to Δ D of FIG. 1D) between a bottom surface 610U of the recess part 610R and the upper surface 110T of the first film pattern 610A may be predetermined as desired.

Thereafter, a fine pattern may be formed from the first film pattern 610A by performing the same processes as described with reference to FIGS. 1E to 1H and 2 to 5.

The first exemplary embodiment with reference to FIGS. 1A to 5 and the second exemplary embodiment with reference to FIGS. 6A and 6B illustrate cases in which the recess part 110R or 610R is formed in the first level area LV1 of the first film 110, a photoresist film is formed on the first film pattern 110A or 610A, an optimal focused electron beam is eradiated on the bottom surface 110U or 610U of the recess part 110R or 610R which is a surface of a relatively low level of the first film pattern 110A or 610A, and a defocused electron beam is eradiated on the upper surface 110T of a relatively high level.

However, the inventive concept is not limited to this. According to a particular application, a fine pattern having a wider width in the second level area LV2 rather than the first level area LV1 may be formed from the first film 110 by forming a recess part to form a bottom surface of a lower level in the second level area LV2 of the first film 110 so that a relatively high level remains on the upper surface 110T in the first level area LV1, forming a photoresist film thereon, eradiating an optimal focused electron beam on the photoresist film on a top of the first level area LV1 disposed relatively distant from the substrate 100, i.e., the upper surface 110T of the first film 110, and eradiating a defocused electron beam on the photoresist film on the second level area LV2 in which a bottom surface of a relatively low level exists.

That is, according to the inventive concept, after a photoresist film is formed on an etched film, an optimal focused electron beam may be eradiated on a portion of a relatively high level of an upper surface of the etched film, and a defocused electron beam may be eradiated on a portion of a relatively low level of the upper surface of the etched film, according to a form of a pattern to be formed and a design condition. In any case of the embodiments, for a final fine pattern obtained from the etched film, a width of a portion formed in an area on which a defocused electron beam is eradiated may be wider than a width of a portion formed in an area on which an optimal focused electron beam is eradiated.

Figure 7:
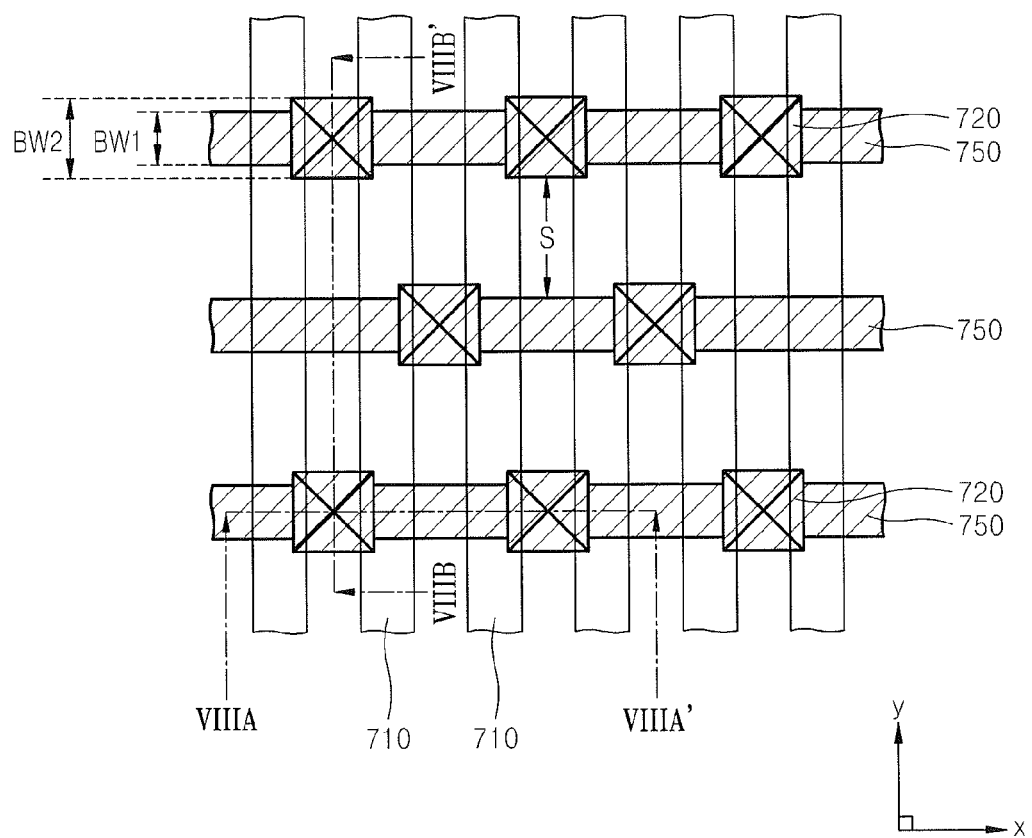
FIG. 7 is a layout of a plurality of fine patterns formable by applying a method for forming a fine pattern according to a third exemplary embodiment of the inventive concept.

FIG. 7 is a layout of a plurality of fine patterns formable by applying a method for forming a fine pattern according to a third exemplary embodiment of the inventive concept.

FIG. 7 illustrates a case in which the plurality of fine patterns are a plurality of bit lines 750 formed in a cell array area of a semiconductor memory device.

Referring to FIG. 7, the plurality of bit lines 750 to be formed by a method according to the inventive concept extend parallel to each other in a predetermined direction (x direction in FIG. 7) on a semiconductor substrate. Below the plurality of bit lines 750 on the semiconductor substrate, a plurality of word lines 710 extend in a direction (y direction in FIG. 7) orthogonal to the plurality of bit lines 750.

A plurality of direct contacts 720 are formed between two neighboring word lines 710. The plurality of direct contacts 720 are formed to electrically connect an active area of the semiconductor substrate and the plurality of bit lines 750 between them.

Because of an increase of density of semiconductor devices, to embody a highly scaled device, each line width BW1 of the plurality of bit lines 750 is becoming increasingly narrow. Each interval between the plurality of bit lines 750 is also getting narrower. The more the density of a semiconductor device increases, the more contact dimensions between each direct contact 720 and a corresponding bit line 750 are reduced. Accordingly, to increase the contact dimensions between each direct contact 720 and a corresponding bit line 750, as illustrated in FIG. 7, it is desirable that the plurality of bit lines 750 be formed to have a width BW2, wider than other portions in a portion contacting the plurality of direct contacts 720 out of the plurality of bit lines 750. In this case, when a light exposure process is performed by producing a photo mask modified to reflect a form of the plurality of bit lines 750 having the width BW2 increased in some areas, if the plurality of bit lines 750 are repetitively formed with a fine sized pitch smaller than a resolution limit of a photolithography process, in a part having the increased width BW2 out of the plurality of bit lines 750, an interval S between the part and each neighboring bit line 750 is too small, and thus, since light may not properly penetrate a part corresponding to each interval S of the photo mask in light exposure, it is difficult to obtain a form of a desired pattern.

In the inventive concept, the plurality of bit lines 750 having the partially increased width BW2 may be formed in a similar fashion to the method for forming a fine pattern described with reference to FIGS. 1A to 5, without the need to produce a special photo mask on which a form of a portion having partially increased width BW2 is reflected in order to form the plurality of bit lines 750 having the partially increased width BW2. This will now be described in more detail.

FIGS. 8A to 8H are sectional views illustrated in accordance with a sequence of process steps to illustrate the method for forming a fine pattern according to the third exemplary embodiment of the inventive concept.

Each of FIGS. 8A to 8H shows a structure corresponding to a section VIIIA-VIIIA' and a section VIIIB-VIIIB' of FIG. 7. In FIGS. 8A to 8H, like reference numerals in FIG. 7 denote like elements.

Figure 8A:
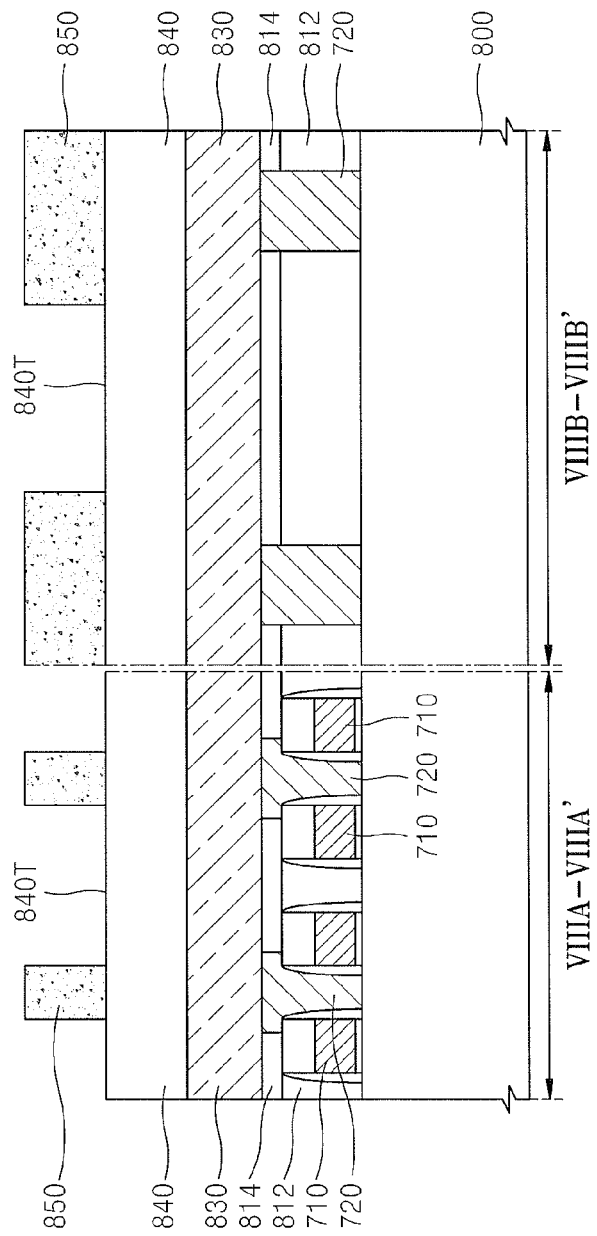

Referring to FIG. 8A, a conductive layer 830 for forming bit lines and a hard mask layer 840 are formed in order on a semiconductor substrate 800 on which the plurality of word lines 710, the plurality of direct contacts 720, and planarized inter-layer insulation films 812 and 814 are formed. Thereafter, a mask pattern 850 covering a portion of an upper surface 840T of the hard mask layer 840 is formed on the hard mask layer 840.

Figure 9:
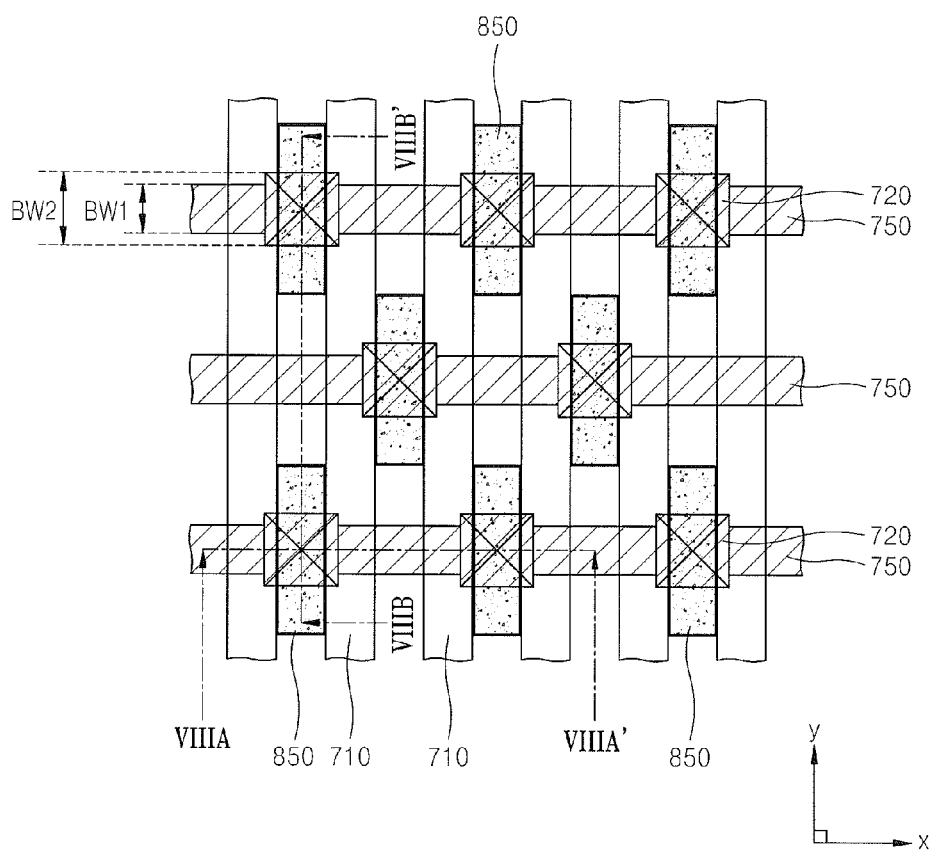
FIG. 9 is a layout illustrating a top view of a mask pattern applied in the method for forming a fine pattern according to the third exemplary embodiment of the inventive concept.

FIG. 9 is a layout illustrating a top view of the mask pattern 850.

Regarding the position of the mask pattern 850 formed on the semiconductor substrate 800, FIG. 9 shows that a layout of the mask pattern 850 overlaps the layout of FIG. 7.

In FIG. 8A, the conductive layer 830 for forming bit lines may include a metal, e.g., tungsten. The hard mask layer 840 may include an oxide film, a nitride film, or a combination of them. The mask pattern 850 may include photoresist materials or materials having a different etching selectivity ratio from the hard mask layer 840.

Figure 8B:
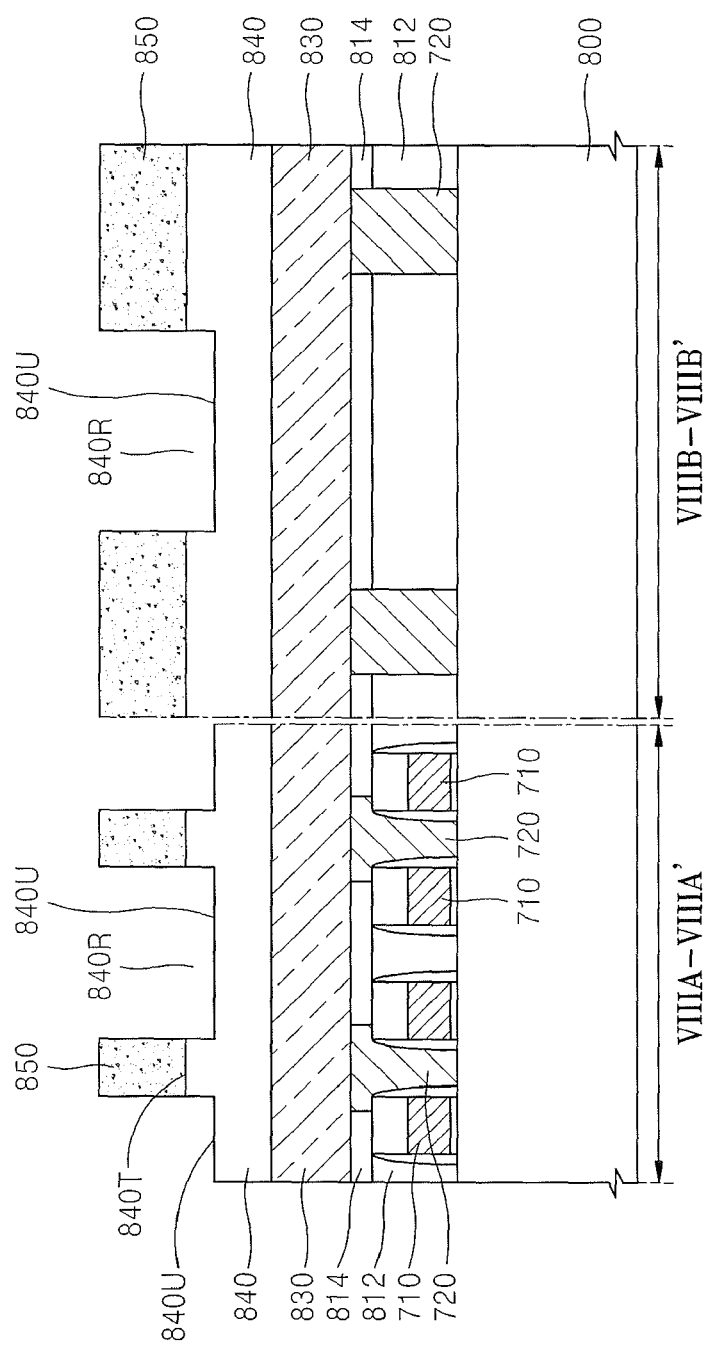

Referring to FIG. 8B, a recess part 840R having a bottom surface 840U at a level lower than that of an upper surface 840T of the hard mask layer 840 is formed by etching a portion from the exposed upper surface 840T of the hard mask layer 840 using the mask pattern 850 as an etching mask.

Figure 8C:
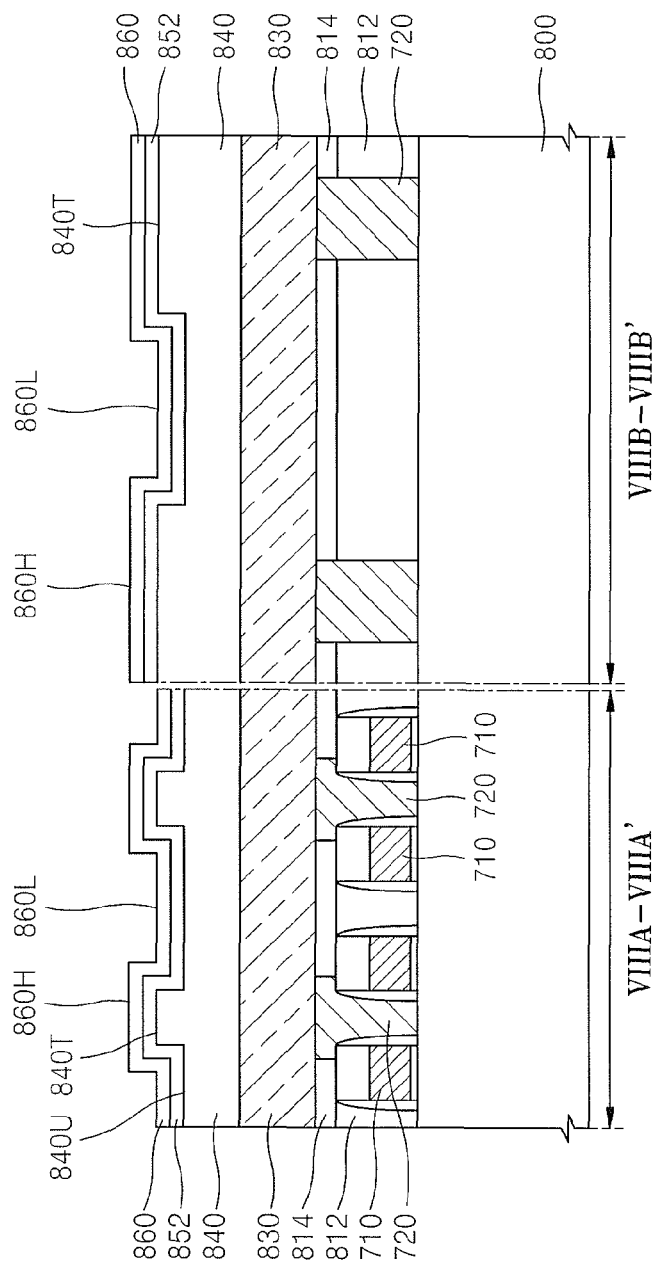

Referring to FIG. 8C, after removing the mask pattern 850 remaining on the hard mask layer 840, an inorganic anti-reflection film 852 and an organic anti-reflection film 860 are formed in order on the upper surface 840T of the hard mask layer 840 and the bottom surface 840U of the recess part 840R. The inorganic anti-reflection film 852 and the organic anti-reflection film 860 may be conformally formed on the hard mask layer 840 according to profiles of the upper surface 840T of the hard mask layer 840 and the bottom surface 840U of the recess part 840R. The inorganic anti-reflection film 852 may include SiON.

Due to a floor level difference between the upper surface 840T of the hard mask layer 840 and the bottom surface 840U of the recess part 840R, after the inorganic anti-reflection film 852 and the organic anti-reflection film 860 are formed, an upper surface of the organic anti-reflection film 860 has an upper surface profile in which a floor level difference exists between a first upper surface 860L at a relatively low level and a second upper surface 860H at a relatively high level. Due to the floor level difference between the first upper surface 860L and the second upper surface 860H, a distance from the semiconductor substrate 800 to the first upper surface 860L is shorter than that from the semiconductor substrate 800 to the second upper surface 860H.

Referring to FIG. 8D, a photoresist film 870 is formed on the organic anti-reflection film 860 on which a floor level difference is formed due to a level difference between the first upper surface 860L and the second upper surface 860H. The photoresist film 870 may include positive photoresist materials.

The photoresist film 870 includes first areas 870F disposed on the first upper surface 860L of the organic anti-reflection film 860 and second areas 870D disposed on the second upper surface 860H of the organic anti-reflection film 860.

Figure 8E:
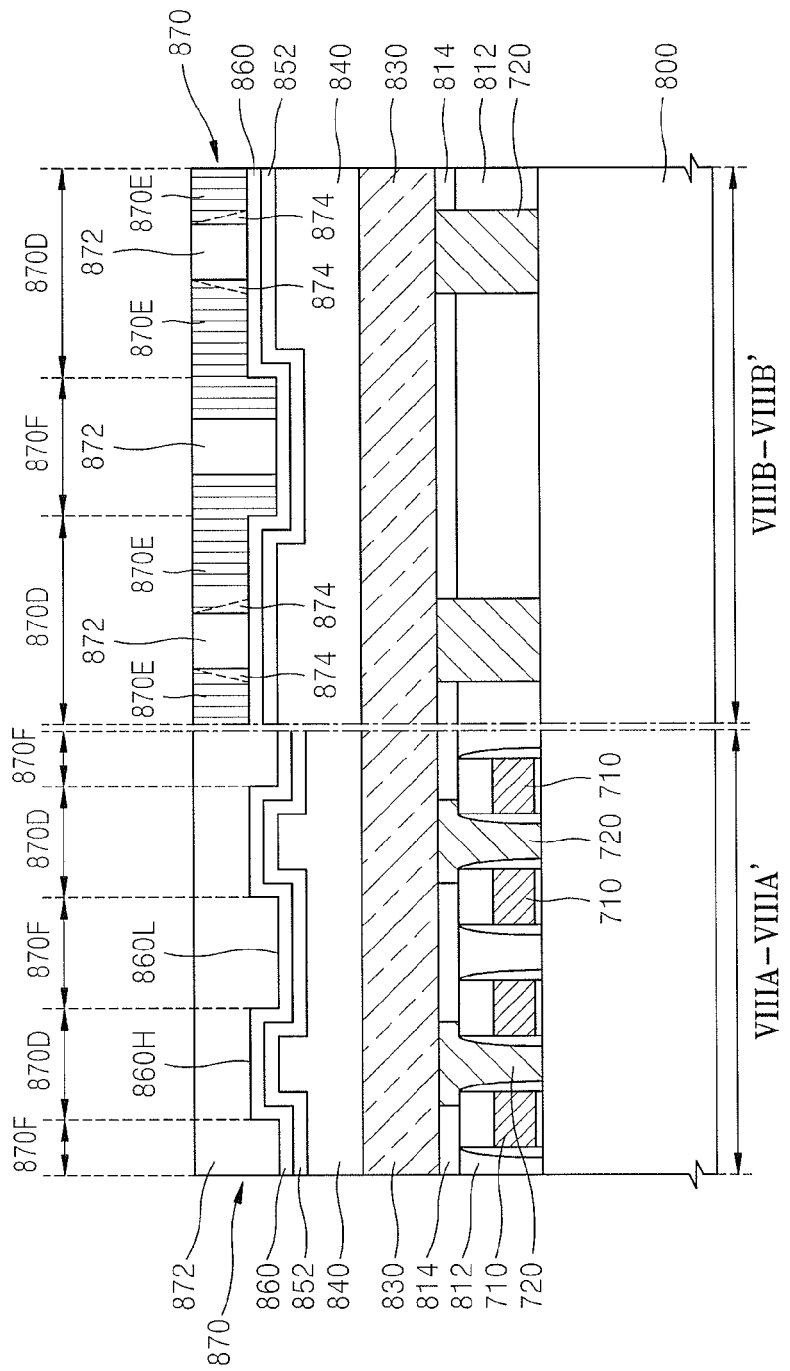

Referring to FIG. 8E, a partial area of the photoresist film 870 is light-exposed using a photo mask having a predetermined light exposure pattern.

In light exposure of the photoresist film 870, similarly as described with reference to FIG. 1F, there is applied a light exposure condition in which an optimal focused electron beam is eradiated on the first upper surface 860L of the organic anti-reflection film 860 and a defocused electron beam is eradiated on the second upper surface 860H of the organic anti-reflection film 860. To do this, an optimal focus position in light exposure of the photoresist film 870 may be set to the first upper surface 860L of the organic anti-reflection film 860. By doing this, an optimal focused electron beam is eradiated on the first area 870F of the photoresist film 870, and a defocused electron beam is eradiated on the second area 870D of the photoresist film 870.

In a light exposure process described with reference to FIG. 8E, the photo mask 200 on which the light exposure pattern 220, for example, is formed may be used as illustrated in FIG. 2. In this case, light exposure areas 870E of the photoresist film 870 may be as illustrated in FIG. 8E.

Figure 10:
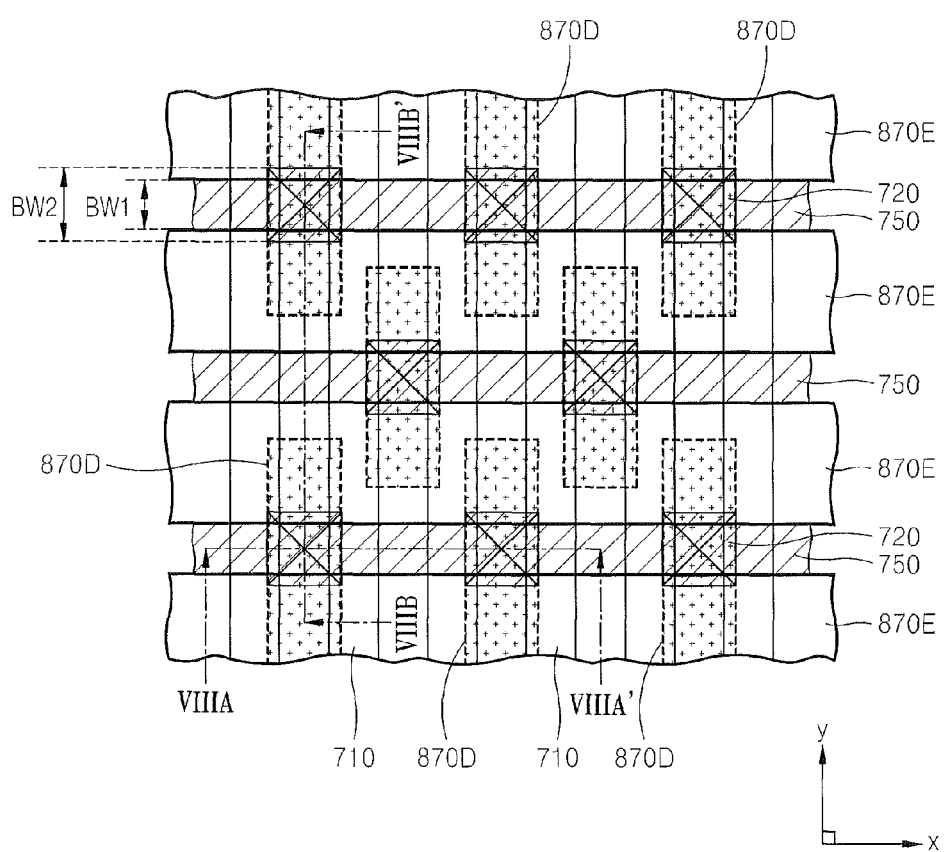
FIG. 10 is a layout illustrating a light exposure area of a photoresist film including an area on which an optimal focused electron beam is eradiated and an area on which a defocused electron beam is eradiated in light exposure in the method for forming a fine pattern according to the third exemplary embodiment of the inventive concept.

FIG. 10 is a layout illustrating the light exposure areas 870E of the photoresist film 870 when the photoresist film 870 is light-exposed using the photo mask illustrated in FIG. 2.

Regarding the position of the light exposure areas 870E of the photoresist film 870 on the semiconductor substrate 800, FIG. 10 shows that the light exposure areas 870E of the photoresist film 870 overlap the layout of FIG. 7.

In FIG. 10, the second area 870D disposed on the second upper surface 860H of the organic anti-reflection film 860 out of the photoresist film 870 is shown together. In the photoresist film 870, the light exposure areas 870E may extend in a direction orthogonal to an extended direction of the second area 870D. FIG. 10 illustrates a case in which the light exposure areas 870E extend in an x direction, i.e., the same direction as an extended direction of each bit line 750, and the second area 870D extends in a y direction, i.e., the same direction as an extended direction of each word line 710.

Referring to FIGS. 8E and 10, in the first area 870F on which an optimal focused electron beam is eradiated out of the light exposure areas 870E of the photoresist film 870, the electron beam in light exposure is evenly eradiated up to the bottom of the photoresist film 870 all over the light exposure areas 870E. However, in the second area 870D on which a defocused electron beam is eradiated out of the light exposure areas 870E of the photoresist film 870, the electron beam in light exposure is not evenly incident in the light exposure areas 870E because of a relatively poor focus due to the eradiation of the defocused electron beam, and the closer from the top of the photoresist film 870 to the bottom thereof, the more areas 874 on which the electron beam is not eradiated in parts adjacent to non-light exposure areas 872 exist. The areas 874 on which the electron beam is not eradiated may be areas under slopes represented with dotted lines in FIG. 8E.

Figure 8F:
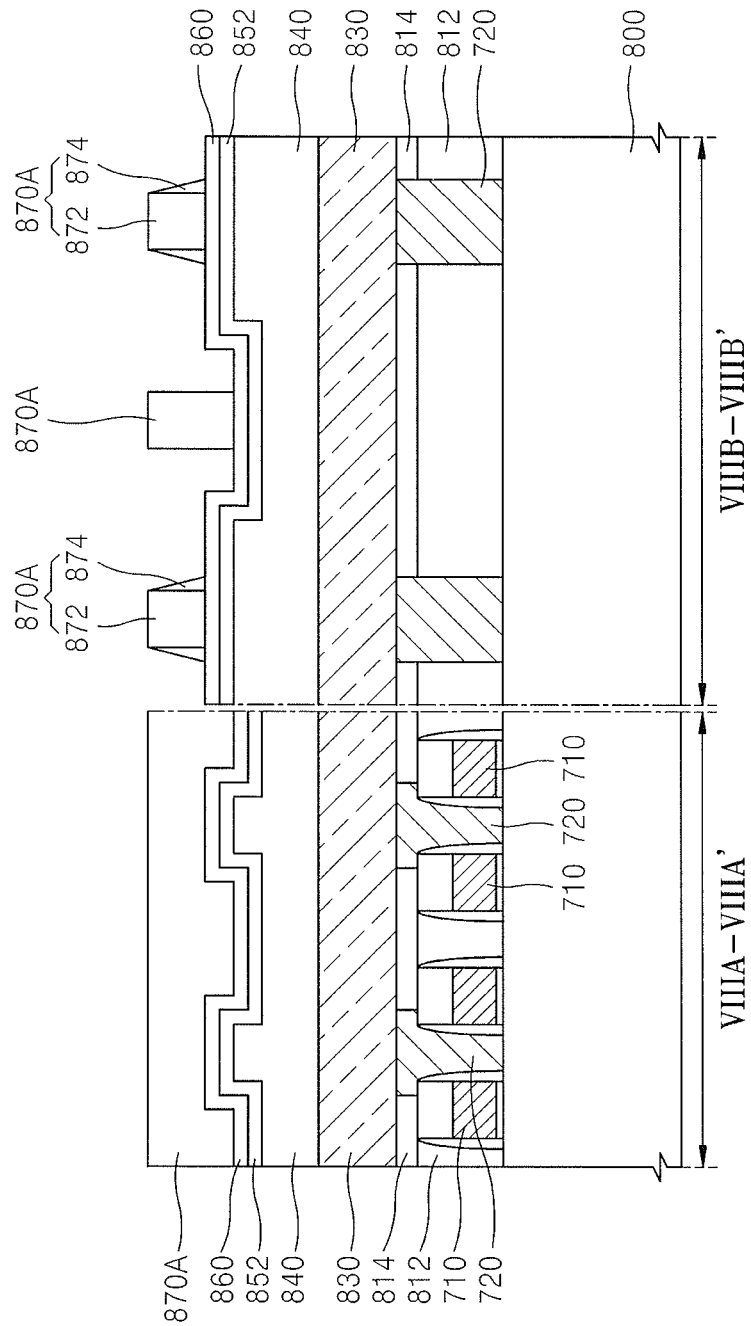

Referring to FIG. 8F, the light-exposed photoresist film 870 is developed. As a result, areas on which the electron beam is eradiated are removed from the photoresist film 870, and a plurality of photoresist patterns 870A including the non-light exposure areas 872 of the photoresist film 870 and the areas 874 on which the electron beam is not eradiated out of the light exposure areas 870E remain on the organic anti-reflection film 860.

Since the areas 874 on which the electron beam is not eradiated, which remain in partial side walls of the non-light exposure areas 872, are included in partial areas of the plurality of photoresist patterns 870A, the plurality of photoresist patterns 870A have a form of lines, each extending to have a variable width in a length direction (x direction in FIGS. 7, 9, and 10). In the plurality of photoresist patterns 870A, each part in which the areas 874 on which the electron beam is not eradiated remain on the side walls of the non-light exposure areas 872 has a width wider than that of each part in which only the non-light exposure areas 872 exist.

Figure 8G:
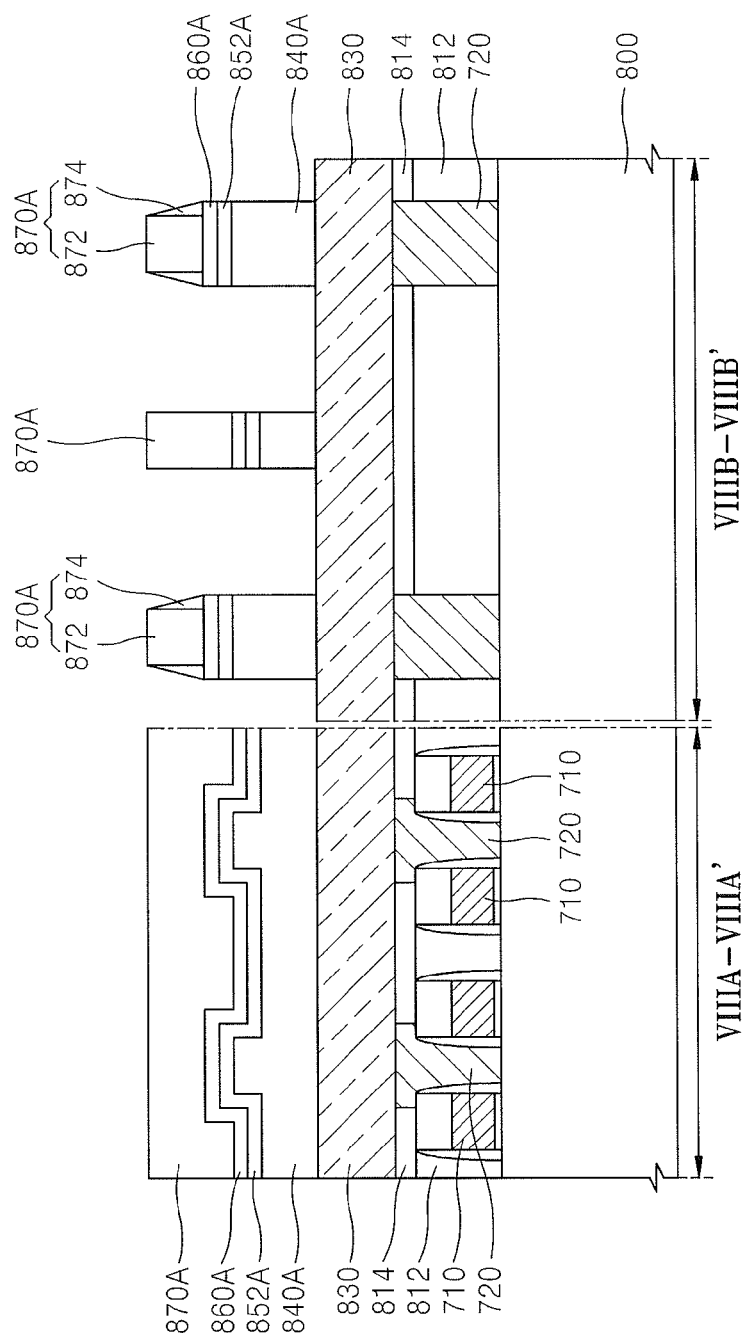

Referring to FIG. 8G, a hard mask pattern 840A, an inorganic anti-reflection film pattern 852A, and an organic anti-reflection film pattern 860A are formed by etching the organic anti-reflection film 860, the inorganic anti-reflection film 852, and the hard mask layer 840 in order using the plurality of photoresist patterns 870A as an etching mask.

While the hard mask pattern 840A is being formed, at least a portion of the plurality of photoresist patterns 870A may be attrited.

Figure 8H:
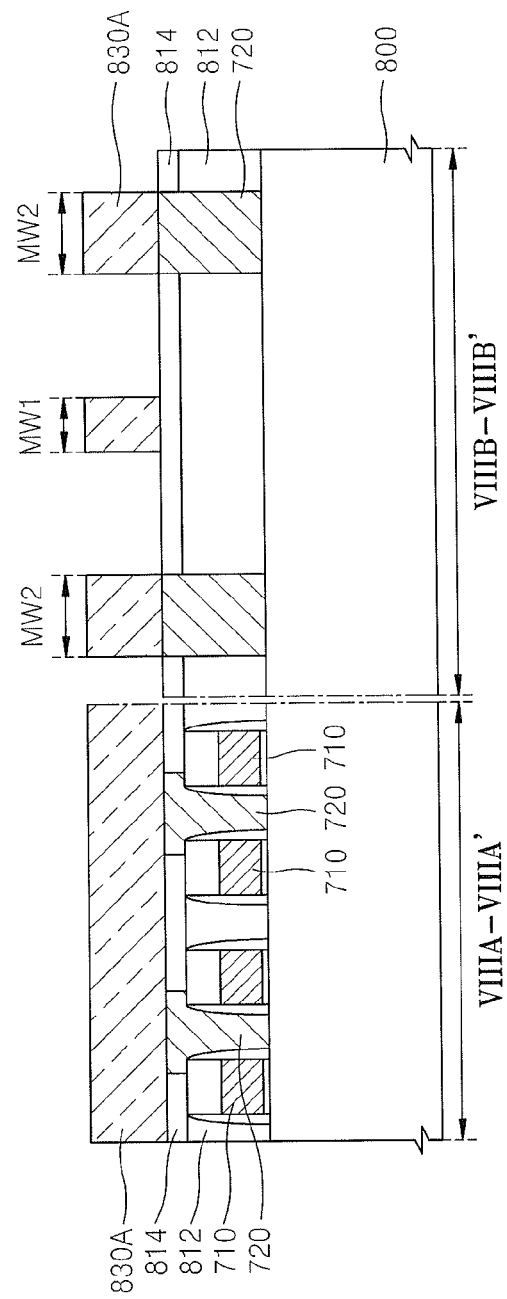

Referring to FIG. 8H, a plurality of conductive lines 830A are formed by etching the conductive layer 830 for forming bit lines using the hard mask pattern 840A as an etching mask. Thereafter, unnecessary films remaining on the plurality of conductive lines 830A are removed.

The plurality of conductive lines 830A may constitute the plurality of bit lines 750 having a planar structure according to the layout of FIG. 7.

The plurality of conductive lines 830A have a line form extending with a variable width in a length direction by including parts having a first width MW1 of a relatively narrow width and parts having a second width MW2 wider than the first width MW1.

The first width MW1 and the second width MW2 of the plurality of conductive lines 830A may correspond to the line width BW1 and the increased width BW2 of the plurality of bit lines 750 of FIG. 7, respectively.

Due to parts having the second width MW2 of a relatively wide width in the plurality of conductive lines 830A, contact dimensions between each direct contact 720 and a corresponding conductive line 830A may be increased in parts in which the plurality of conductive lines 830A and the plurality of direct contacts 720 are connected to each other.

In the method for forming a fine pattern according to the third exemplary embodiment of the inventive concept described with reference to FIGS. 7 to 10, in order to form the plurality of bit lines 750 illustrated in FIG. 7, there is used a method for providing a floor level difference on the upper surface of the organic anti-reflection film 860 formed on the hard mask layer 840 by etching a portion of the hard mask layer 840 to form a floor level difference for eradiating a defocused electron beam onto the photoresist film 870 in light exposure. However, various changes and modifications may be performed within the scope of the inventive concept. For example, in order to form a level difference structure covered by the photoresist film 870, instead of the method for forming a floor level difference by etching the hard mask layer 840, a floor level difference for eradiating a defocused electron beam on an upper surface of the inorganic anti-reflection film 852 may be created by etching a portion of the inorganic anti-reflection film 852 formed on the hard mask layer 840.

Figure 11:
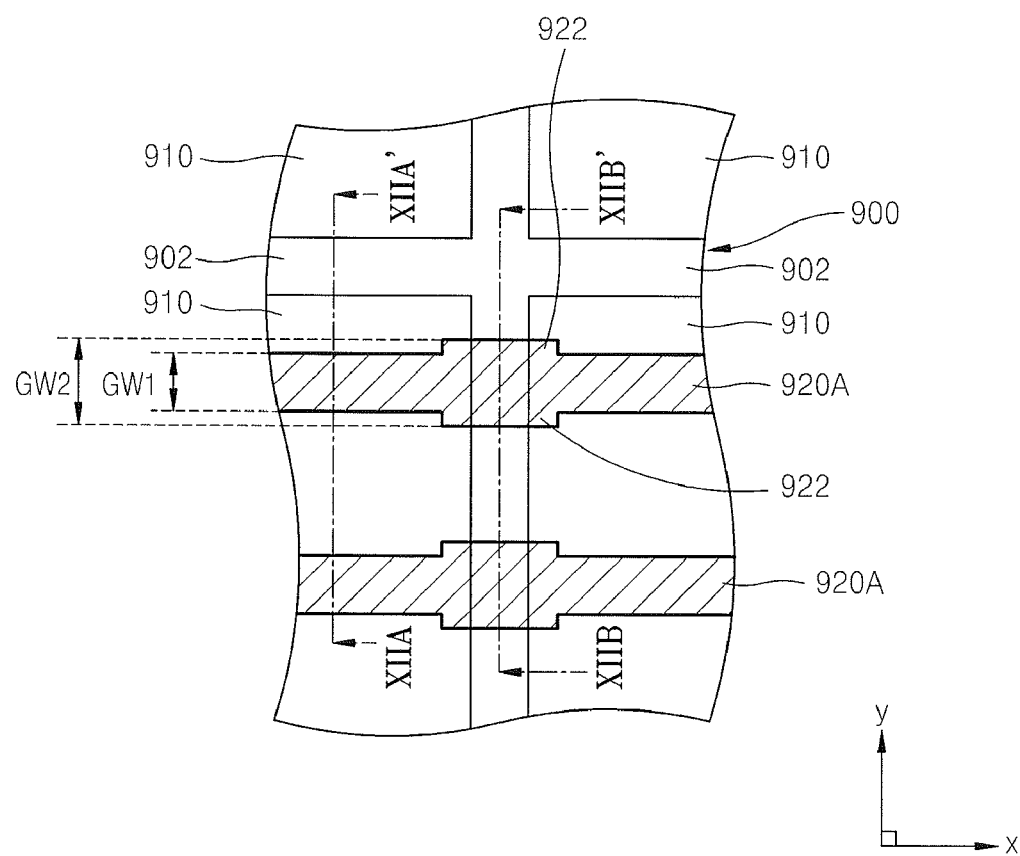
FIG. 11 is a layout of a plurality of fine patterns to be formed by a method for forming a fine pattern according to a fourth exemplary embodiment of the inventive concept.

FIG. 11 is a layout of a plurality of fine patterns to be formed by a method for forming a fine pattern according to a fourth exemplary embodiment of the inventive concept.

FIG. 11 illustrates a case in which the plurality of fine patterns to be formed are a plurality of word lines formed in a core area or a peripheral circuit area of a semiconductor device.

Referring to FIG. 11, a plurality of active areas 910 are defined on a substrate 900 on which by an isolation area 902.

A plurality of word lines 920A formed according to the method of the fourth exemplary embodiment continuously extend in a constant direction (x direction in FIG. 11) over the active areas 910 and the isolation area 902 so as to traverse the active areas 910 and the isolation area 902.

High density of semiconductor devices results in active areas of the semiconductor devices being decreased is size and a channel length of transistors to be reduced in size. Accordingly, in order to control a Hot Electron Induced Punch-through (HEIP) effect that may occur in any of the boundaries between active areas and an isolation area, it is desirable that a width of each word line be formed wider in a corresponding boundary between the active areas and the isolation area.

Therefore, each of the plurality of word lines 920A includes tabs 922 protruded to both sides therefrom in a partial area disposed on each boundary between the active areas 910 and the isolation area 902. Parts of the word lines 922A having the tabs 922 have a second width GW2 wider than a first width GW1 of parts without the tabs 922.

In a case of producing a photo mask having a light exposure pattern of a form according to the layout of FIG. 11 to form the plurality of word lines 920A including the tabs 922 and using the photo mask in a light exposure process, there may appear a phenomenon that a pattern length is shorter than desired or an edge or corner part is rounded due to an optical proximity effect as a pattern size is becoming increasingly finer. Due to this, in a case of embodying the plurality of word lines 920A of FIG. 11 by means of a light exposure process using a photo mask produced to have a light exposure pattern of a form according to the layout of FIG. 11, it is difficult to secure a channel length as long as desired in boundaries between the active areas 910 and the isolation area 902.

In the inventive concept, depending on a form of a portion having the second width GW2 in order to form the plurality of word lines 920A having the partially increased second width GW2 by including the tabs 922, the plurality of word lines 920A having the second width GW2 may be formed in a similar fashion to the method for forming a fine pattern described with reference to FIGS. 1A to 5, without needing to produce a special photo mask. This will now be described in more detail.

FIGS. 12A to 12H are sectional views illustrated in accordance with a sequence of process steps to describe the method for forming a fine pattern according to the fourth exemplary embodiment of the inventive concept.

Each of FIGS. 12A to 12H shows a structure corresponding to a section XIIA-XIIA' and a section XIIB-XIIB' of FIG. 11. In FIGS. 12A to 12H, like reference numerals in FIG. 11 denote like elements.

Figure 12A:
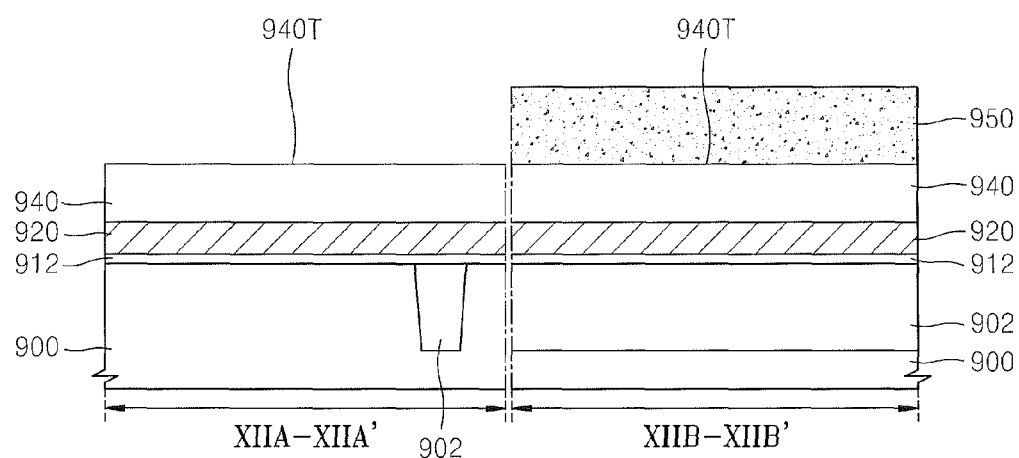
FIGS. 12A to 12H are sectional views illustrated in accordance with a sequence of process steps to illustrate the method for forming a fine pattern according to the fourth exemplary embodiment of the inventive concept.

Referring to FIG. 12A, a gate insulation film 912 and a conductive layer 920 for forming word lines are formed in order on the semiconductor substrate 900 on which a plurality of active areas are defined by the isolation area 902.

The gate insulation film 912 may include a silicon oxide film, a silicon oxide nitride film, a high-k film consisting of a metal oxide, or a combination of them. The conductive layer 920 for forming word lines may include a poly-silicon film, a metal film, a metal silicide film, or a combination of them.

Thereafter, a hard mask layer 940 is formed on the conductive layer 920 for forming word lines, and a mask pattern 950 covering a portion of an upper surface 940T of the hard mask layer 940 is formed on the hard mask layer 940. The mask pattern 950 may include photoresist materials or materials having a different etching selectivity ratio from that of the hard mask layer 940.

Additional details of the hard mask layer 940 and the mask pattern 950 are described in connection with the hard mask layer 840 and the mask pattern 850 described with reference to FIG. 8A.

Figure 13:
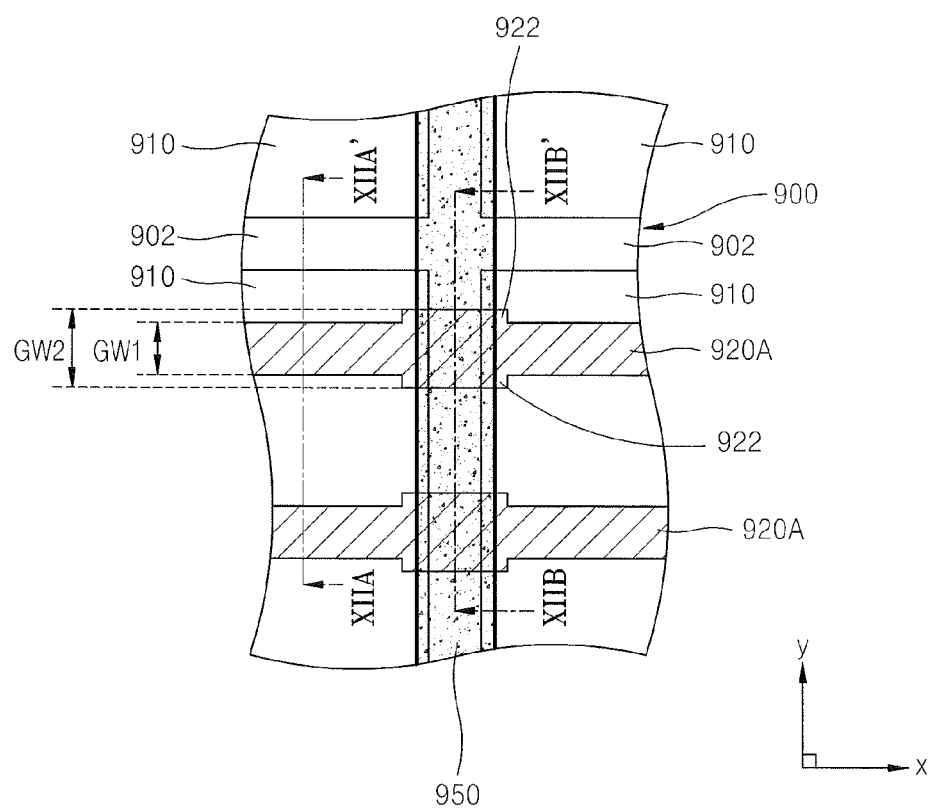
FIG. 13 is a layout illustrating a top view of a mask pattern applied in the method for forming a fine pattern according to the fourth exemplary embodiment of the inventive concept.

FIG. 13 is a layout illustrating a top view of the mask pattern 950.

Regarding the position of the mask pattern 950 formed on the semiconductor substrate 900, FIG. 13 shows that the layout of the mask pattern 950 overlaps the layout of FIG. 11.

Figure 12B:
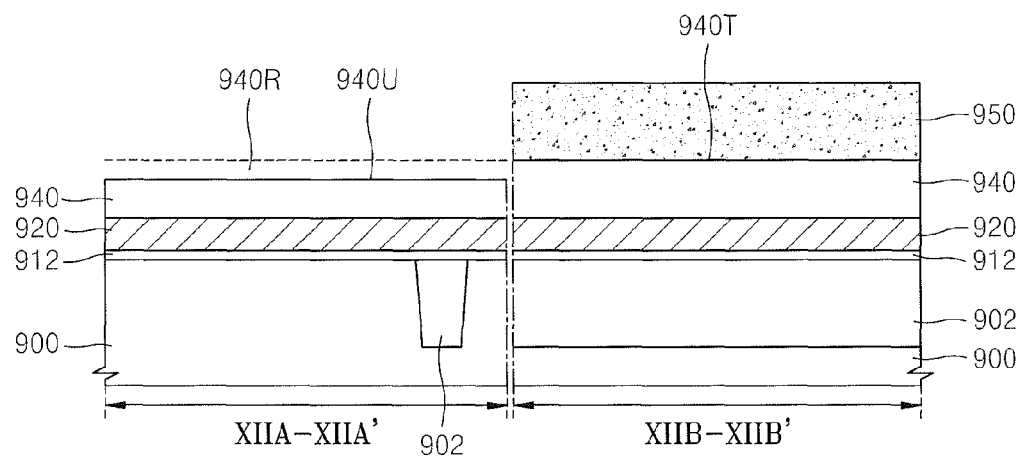

Referring to FIG. 12B, a recess part 940R having a bottom surface 940U of a level lower than that of the upper surface 940T of the hard mask layer 940 is formed by etching a portion from the exposed upper surface 940T of the hard mask layer 940 using the mask pattern 950 as an etching mask.

Figure 12C:
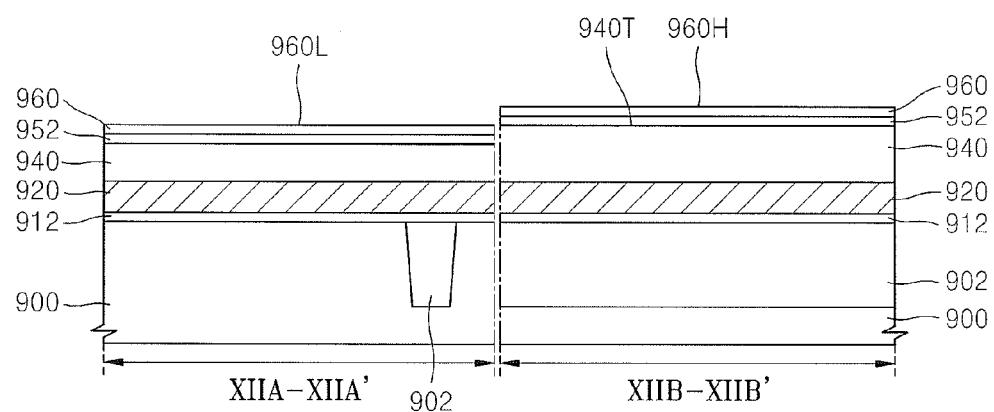

Referring to FIG. 12C, after removing the mask pattern 950 remaining on the hard mask layer 940, an inorganic anti-reflection film 952 and an organic anti-reflection film 960 are formed in order on the upper surface 940T of the hard mask layer 940 and the bottom surface 940U of the recess part 940R. The inorganic anti-reflection film 952 and the organic anti-reflection film 960 may be conformally formed on the hard mask layer 940 according to profiles of the upper surface 940T of the hard mask layer 940 and the bottom surface 940U of the recess part 940R.

Due to a floor level difference between the upper surface 940T of the hard mask layer 940 and the bottom surface 940U of the recess part 940R, after the inorganic anti-reflection film 952 and the organic anti-reflection film 960 are formed, an upper surface of the organic anti-reflection film 960 has an upper surface profile in which a floor level difference exists between a first upper surface 960L of a relatively low level and a second upper surface 960H of a relatively high level. Due to the floor level difference between the first upper surface 960L and the second upper surface 960H, a distance from the semiconductor substrate 900 to the first upper surface 960L is shorter than that from the semiconductor substrate 900 to the second upper surface 960H.

Figure 12D:
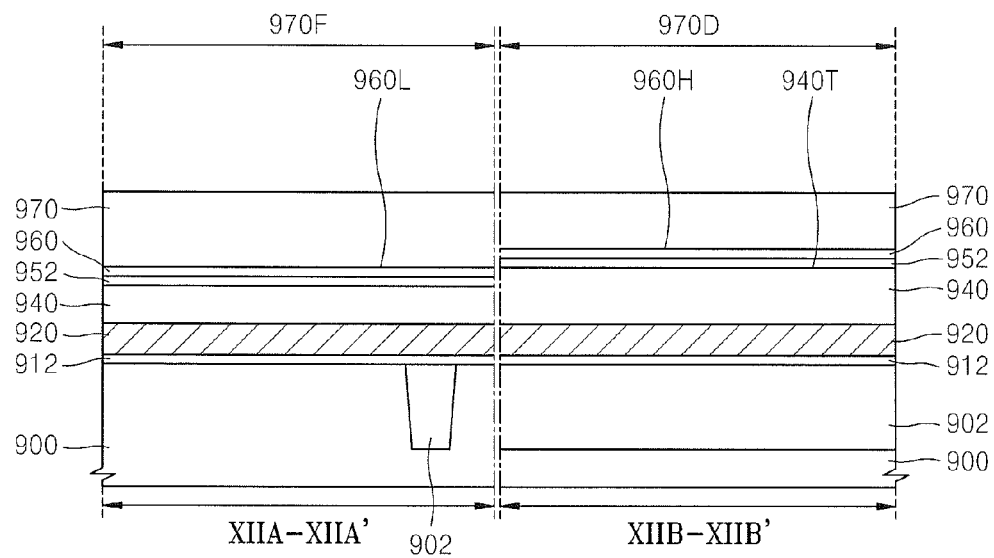

Referring to FIG. 12D, a photoresist film 970 is formed on the organic anti-reflection film 960 on which a floor level difference is formed due to a level difference between the first upper surface 960L and the second upper surface 960H. The photoresist film 970 may include positive photoresist materials.

The photoresist film 970 includes a first area 970F disposed on the first upper surface 960L of the organic anti-reflection film 960 and a second area 970D disposed on the second upper surface 960H of the organic anti-reflection film 960.

Figure 12E:
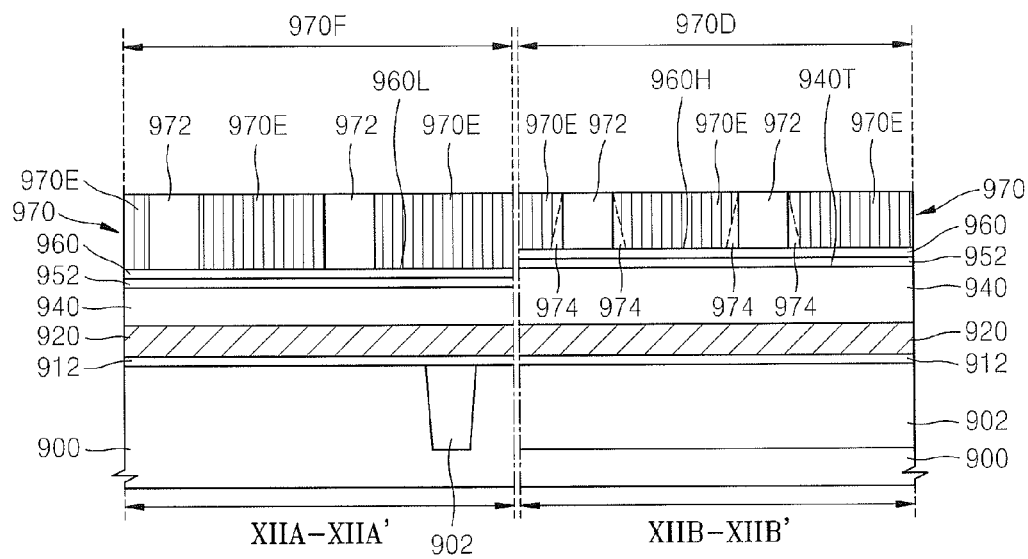

Referring to FIG. 12E, a partial area of the photoresist film 970 is light-exposed by using a photo mask having a predetermined light exposure pattern.

In light exposure of the photoresist film 970, similarly as described with reference to FIG. 1F, there is applied a light exposure condition in which an optimal focused electron beam is eradiated on the first upper surface 960L of the organic anti-reflection film 960 and a defocused electron beam is eradiated on the second upper surface 960H of the organic anti-reflection film 960. To do this, an optimal focus position in light exposure of the photoresist film 970 may be set to the first upper surface 960L of the organic anti-reflection film 960. By doing this, an optimal focused electron beam is eradiated on the first area 970F of the photoresist film 970, and a defocused electron beam is eradiated on the second area 970D of the photoresist film 970.

Figure 14:
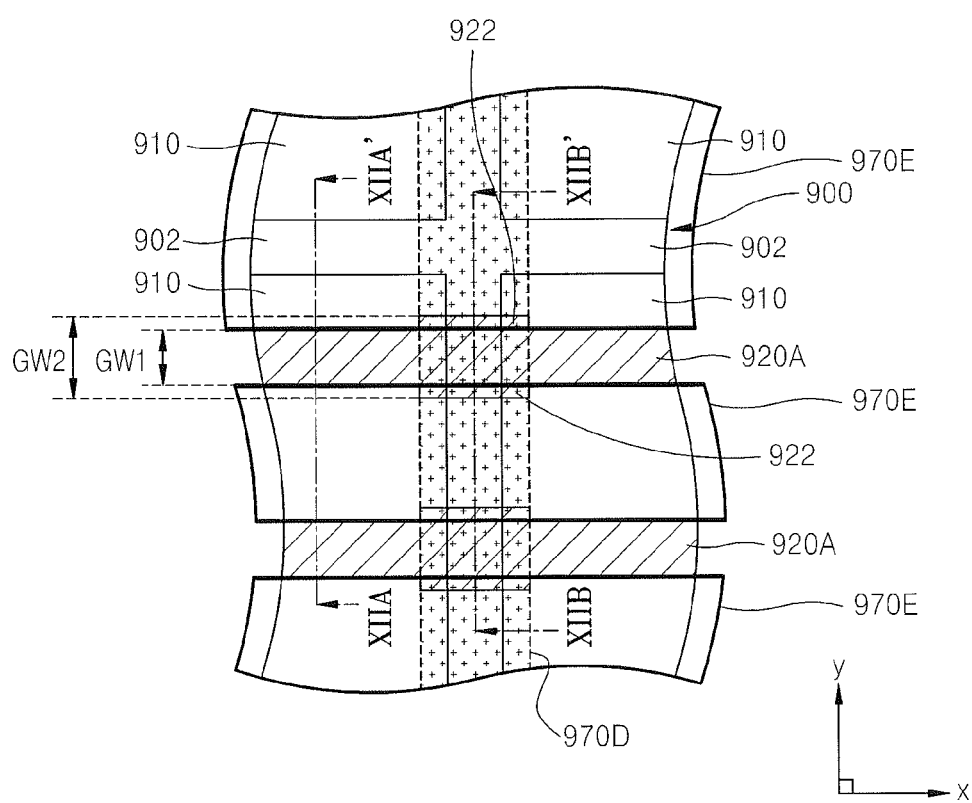
FIG. 14 is a layout illustrating a light exposure area of a photoresist film including an area on which an optimal focused electron beam is eradiated and an area on which a defocused electron beam is eradiated in light exposure in the method for forming a fine pattern according to the fourth exemplary embodiment of the inventive concept.

FIG. 14 is a layout illustrating light exposure areas 970E of the photoresist film 970 in the light exposure process described with reference to FIG. 12E.

Regarding the position of the light exposure areas 970E of the photoresist film 970, FIG. 14 shows that the light exposure areas 970E of the photoresist film 970 overlaps the layout of FIG. 11.

In FIG. 14, the second area 970D disposed on the second upper surface 960H of the organic anti-reflection film 960 out of the photoresist film 970 is shown together. In the photoresist film 970, the light exposure areas 970E may extend in a direction orthogonal to an extended direction of the second area 970D. FIG. 14 illustrates a case in which the light exposure areas 970E extend in an x direction, and the second area 970D extends in a y direction.

Referring to FIGS. 12E and 14, in the first area 970F on which an optimal focused electron beam is eradiated out of the light exposure areas 970E of the photoresist film 970, the electron beam in light exposure is evenly eradiated up to the bottom of the photoresist film 970 all over the light exposure areas 970E. However, in the second area 970D on which a defocused electron beam is eradiated out of the light exposure areas 970E of the photoresist film 970, the electron beam in light exposure is not evenly incident in the light exposure areas 970E because of a relatively poor focus due to the eradiation of the defocused electron beam, and the closer from the top of the photoresist film 970 to the bottom thereof, the more areas 974 on which the electron beam is not eradiated in parts adjacent to non-light exposure areas 972 exist. The areas 974 on which the electron beam is not eradiated may be areas under slopes represented with dotted lines in FIG. 12E.

Figure 12F:
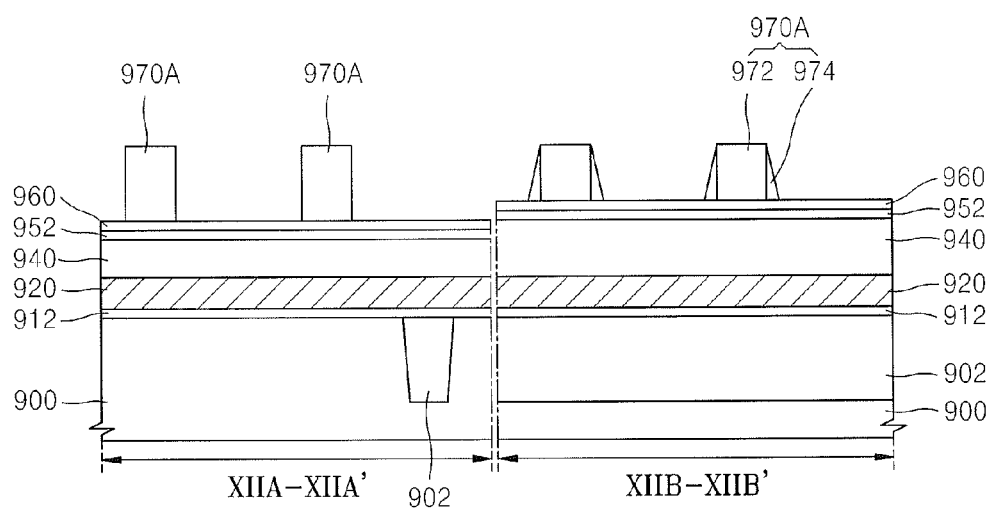

Referring to FIG. 12F, the light-exposed photoresist film 970 is developed. As a result, areas on which the electron beam is eradiated are removed from the photoresist film 970, and a plurality of photoresist patterns 970A including the non-light exposure areas 972 of the photoresist film 970 and the areas 974 on which the electron beam is not eradiated out of the light exposure areas 970E remain on the organic anti-reflection film 960.

Since the areas 974 on which the electron beam is not eradiated, which remain in partial side walls of the non-light exposure areas 972, are included in partial areas of the plurality of photoresist patterns 970A, the plurality of photoresist patterns 970A have a form of lines, each extending to have a variable width in a length direction (x direction in FIG. 14). In the plurality of photoresist patterns 970A, each part in which the areas 974 on which the electron beam is not eradiated remain on the side walls of the non-light exposure areas 972 has a width wider than that of each part in which only the non-light exposure areas 972 exist.

Figure 12G:
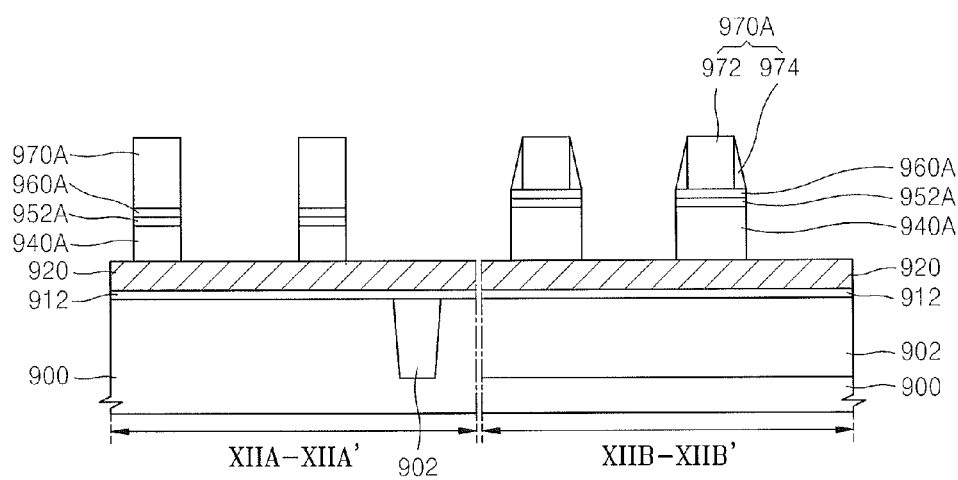

Referring to FIG. 12G, a hard mask pattern 940A, an inorganic anti-reflection film pattern 952A, and an organic anti-reflection film pattern 960A are formed by etching the organic anti-reflection film 960, the inorganic anti-reflection film 952, and the hard mask layer 940 in order using the plurality of photoresist patterns 970A as an etching mask. While the hard mask pattern 940A is being formed, at least a portion of the plurality of photoresist patterns 970A may be attrited.

Figure 12H:
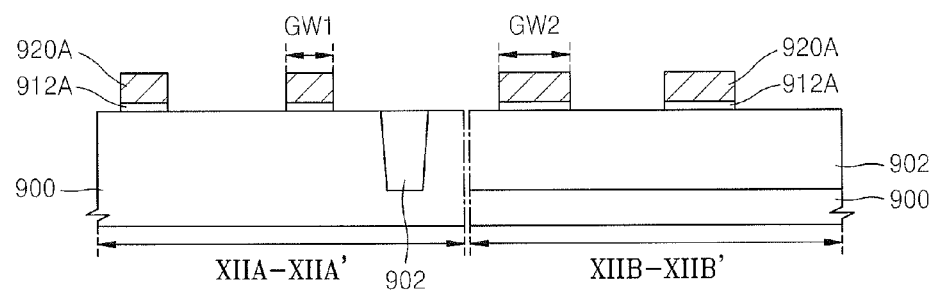

Referring to FIG. 12H, the plurality of word lines 920A and a gate insulation film pattern 912A are formed by etching the conductive layer 920 for forming word lines and the gate insulation film 912 using the hard mask pattern 940A as an etching mask. Thereafter, unnecessary films remaining on the plurality of word lines 920A are removed.

The plurality of word lines 920A have the planar structure shown in the layout of FIG. 11.

The plurality of word lines 920A have a line form extending with a variable width in a length direction (x direction in FIG. 11) by including parts having the first width GW1 of a relatively narrow width and parts having the second width GW2 wider than the first width GW1.

Due to parts having the second width GW2 of a relatively wide width in the plurality of word lines 920A, a length of channels formed below the plurality of word lines 920A in the plurality of active areas 910 of the semiconductor substrate 900 may be increased. As in the current embodiment, by forming parts of the word lines 920A extending on boundaries between the plurality of active areas 910 and the isolation area 902 to have the second width GW2 larger than the other parts, a channel length increases in the formed parts, thereby being able to control the HEIP effect occurring in the boundaries between the plurality of active areas 910 and the isolation area 902.

In the method for forming a fine pattern according to the fourth exemplary embodiment of the inventive concept described with reference to FIGS. 11 to 14, in order to form the plurality of word lines 920A illustrated in FIG. 11, there is used a method for providing a floor level difference on the upper surface of the organic anti-reflection film 960 formed on the hard mask layer 940 by etching a portion of the hard mask layer 940 to form a floor level difference for eradiating a defocused electron beam onto the photoresist film 970 in light exposure. However, various changes and modifications may be performed within the scope of the inventive concept. For example, in order to form a level difference structure covered by the photoresist film 970, instead of the method for forming a floor level difference by etching the hard mask layer 940, a floor level difference for eradiating a defocused electron beam on an upper surface of the inorganic anti-reflection film 952 may be formed by etching a portion of the inorganic anti-reflection film 952 formed on the hard mask layer 940.

Figure 15:
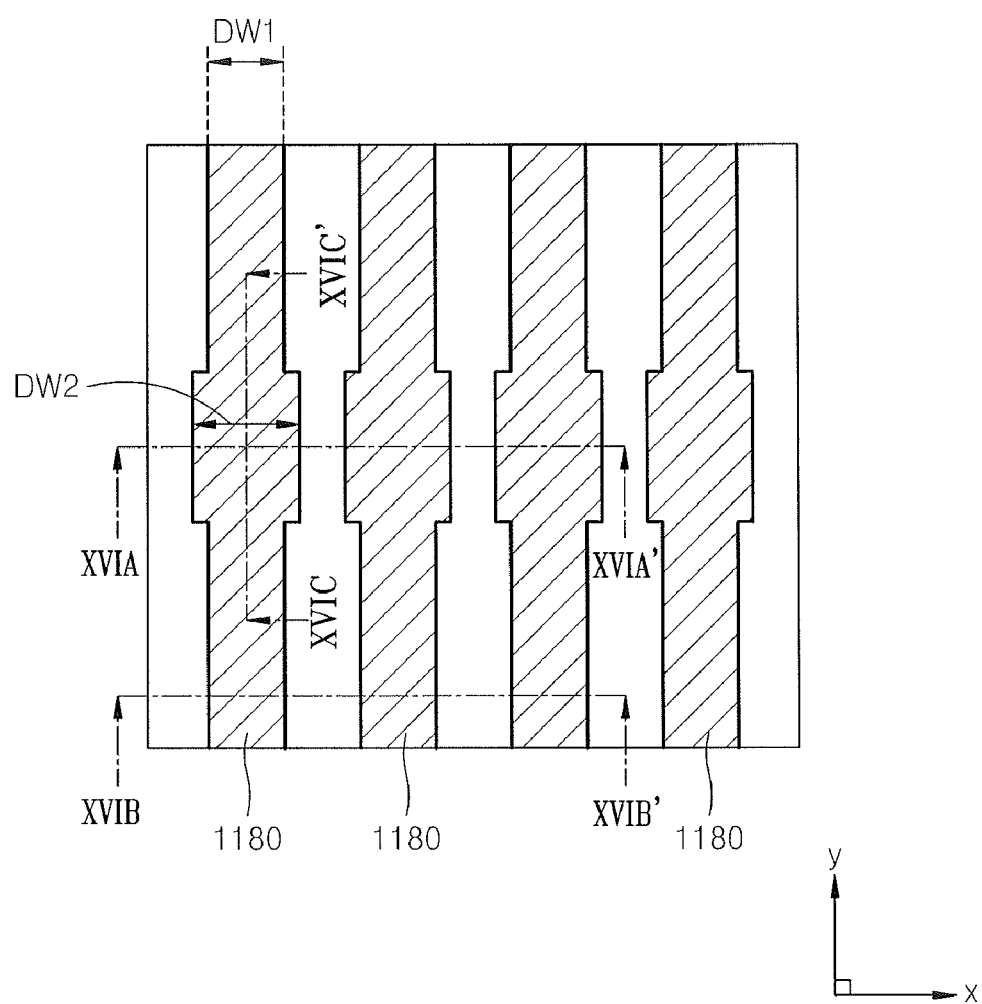
FIG. 15 is a layout of a plurality of wiring patterns to be formed by a method for forming a fine pattern according to a fifth exemplary embodiment of the inventive concept.

FIG. 15 is a top view of a plurality of wiring patterns 1180 to be formed by a method for forming a fine pattern according to a fifth exemplary embodiment of the inventive concept.

The plurality of wiring patterns 1180 extend parallel to each other, each having a first width DW1. Each of the plurality of wiring patterns 1180 has an increased second width DW2 in a partial area thereof.

FIGS. 16A to 16J are sectional views illustrated in accordance with a sequence of process steps to illustrate the method for forming a fine pattern according to the fifth exemplary embodiment of the inventive concept.

In the fifth exemplary embodiment to be described with reference to FIGS. 16A to 16J, a method for forming the plurality of wiring patterns 1180 illustrated in FIG. 15 uses a damascene process. The plurality of wiring patterns 1180 formed using the damascene process according to the current exemplary embodiment may constitute a plurality of bit lines needed to embody a semiconductor device or various kinds of metal wiring layers to perform various functions.

Each of FIGS. 16A to 16J shows a structure corresponding to a section XVIA-XVIA', a section XVIB-XVIB', and a section XVIC-XVIC' of FIG. 15. In FIGS. 16A to 16J, like reference numerals in FIG. 15 denote like elements.

Figure 16A:
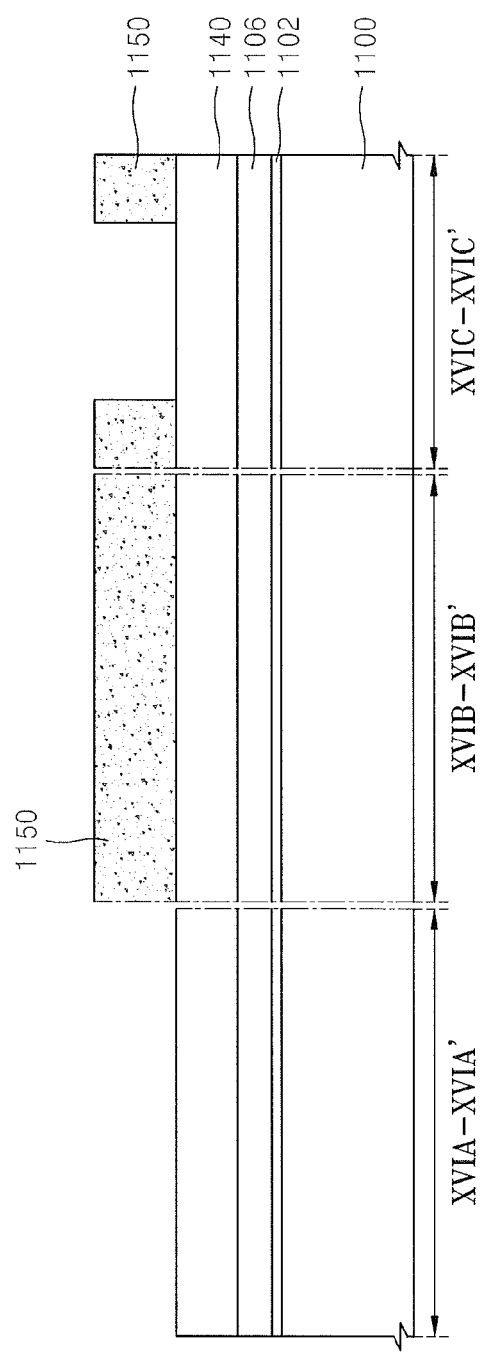

Referring to FIG. 16A, an etching stop layer 1102 is formed on a substrate 1100 on which predetermined unit devices, e.g., a plurality of word lines and an inter-layer insulation film covering them, are formed. A mold layer 1106 is formed on the etching stop layer 1102. The etching stop layer 1102 may include, for example, a silicon nitride film, and the mold layer 1106 may include, for example, an oxide film.

A hard mask layer 1140 is formed on the mold layer 1106. The hard mask layer 1140 may include materials having a different etching selectivity ratio from that of the mold layer 1106. For example, when the mold layer 1106 includes an oxide film, the hard mask layer 1140 may include a nitride film or a poly-silicon film.

A mask pattern 1150 covering a portion of an upper surface 1140T of the hard mask layer 1140 is formed on the hard mask layer 1140. The mask pattern 1150 may include photoresist materials or materials having a different etching selectivity ratio from that of the hard mask layer 1140.

Figure 17:
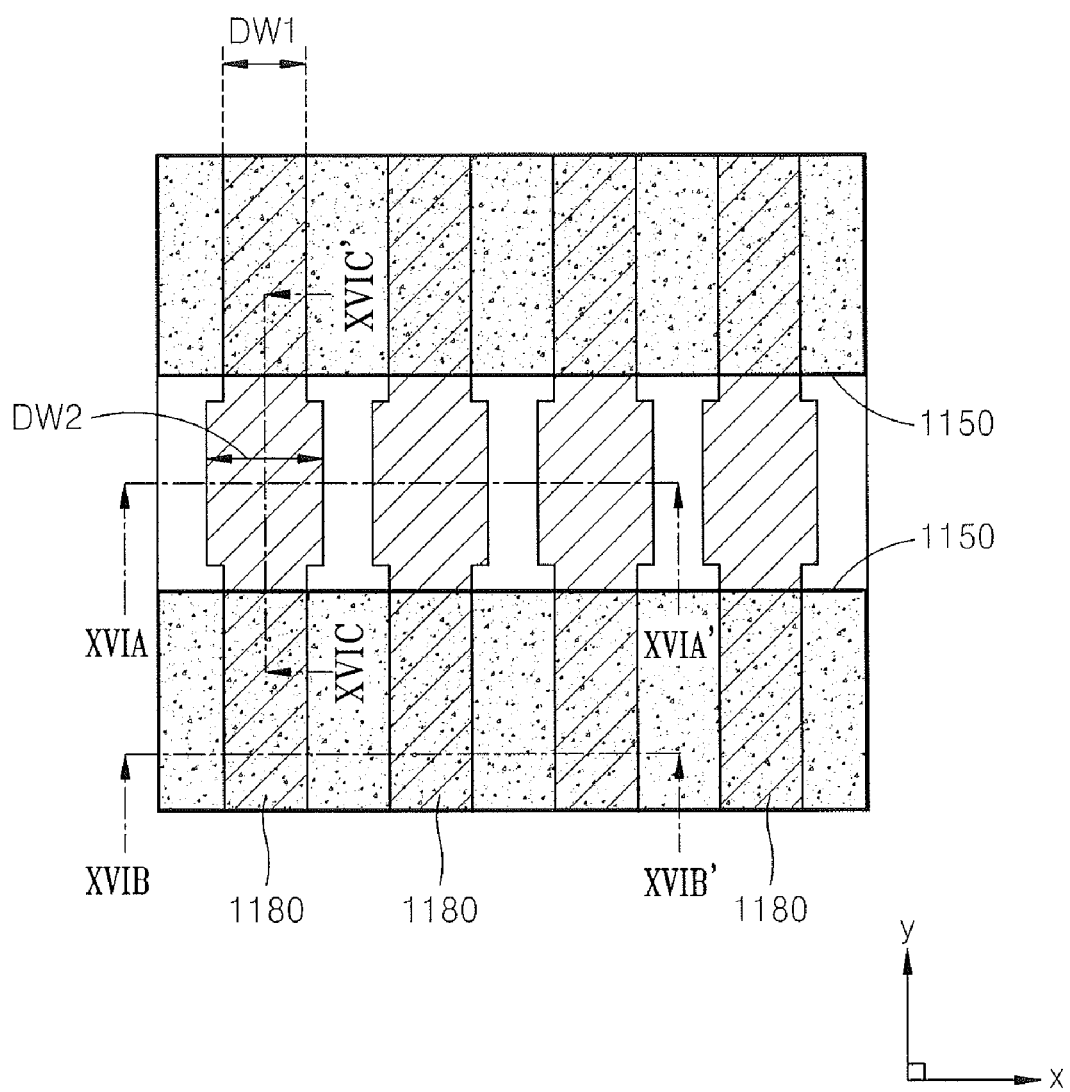
FIG. 17 is a layout illustrating a top view of a mask pattern applied in the method for forming a fine pattern according to the fifth exemplary embodiment of the inventive concept.

FIG. 17 is a layout illustrating a top view of the mask pattern 1150.

Regarding the position of the mask pattern 1150 formed on the semiconductor substrate 1100, FIG. 17 shows that the layout of the mask pattern 1150 overlaps the layout of the FIG. 15.

Figure 16B:
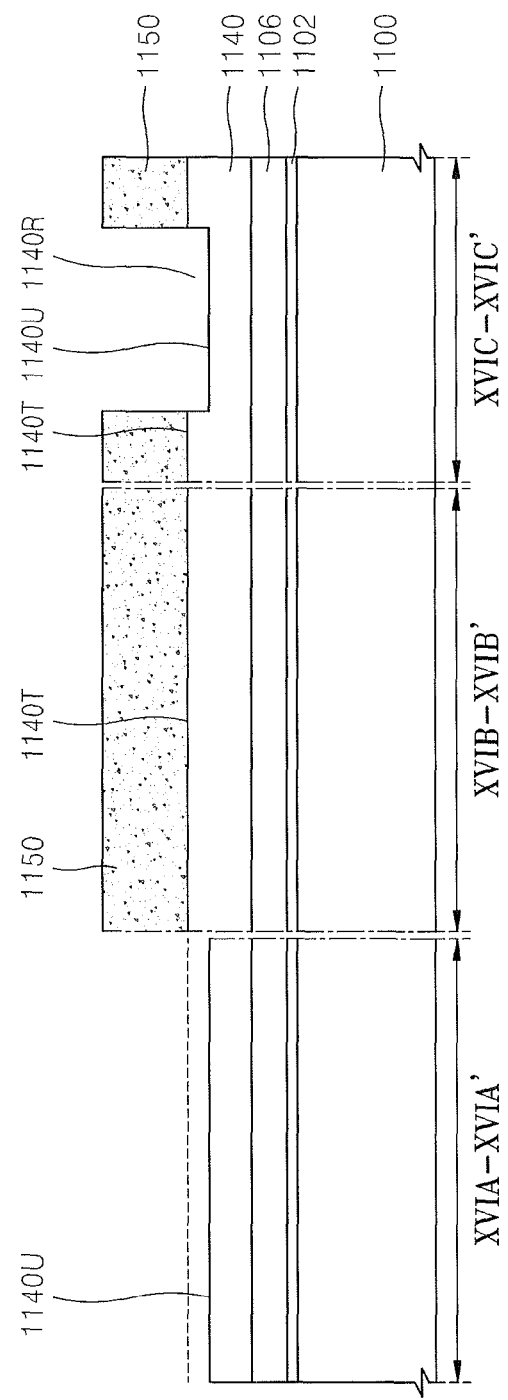

Referring to FIG. 16B, a recess part 1140R having a bottom surface 1140U of a level lower than that of the upper surface 1140T of the hard mask layer 1140 is formed by etching a portion from the exposed upper surface 1140T of the hard mask layer 1140 using the mask pattern 1150 as an etching mask.

Figure 16C:
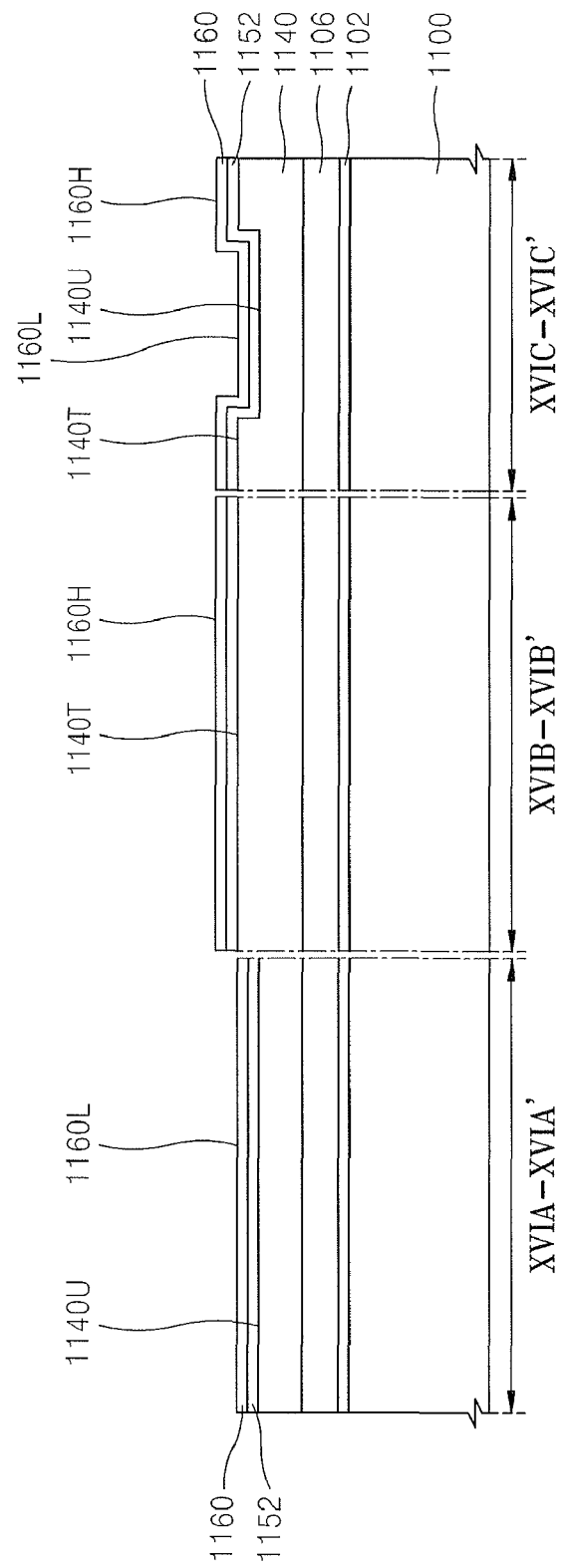

Referring to FIG. 16C, after removing the mask pattern 1150 remaining on the hard mask layer 1140, an inorganic anti-reflection film 1152 and an organic anti-reflection film 1160 are formed in order on the upper surface 1140T of the hard mask layer 1140 and the bottom surface 1140U of the recess part 1140R. The inorganic anti-reflection film 1152 and the organic anti-reflection film 1160 may be conformally formed on the hard mask layer 1140 according to profiles of the upper surface 1140T of the hard mask layer 1140 and the bottom surface 1140U of the recess part 1140R.

Due to a floor level difference between the upper surface 1140T of the hard mask layer 1140 and the bottom surface 1140U of the recess part 1140R, even after the inorganic anti-reflection film 1152 and the organic anti-reflection film 1160 are formed, an upper surface of the organic anti-reflection film 1160 has an upper surface profile in which a floor level difference exists between a first upper surface 1160L of a relatively low level and a second upper surface 1160H of a relatively high level. Due to the floor level difference between the first upper surface 1160L and the second upper surface 1160H, a distance from the semiconductor substrate 1100 to the first upper surface 1160L is shorter than that from the semiconductor substrate 1100 to the second upper surface 1160H.

Figure 16D:
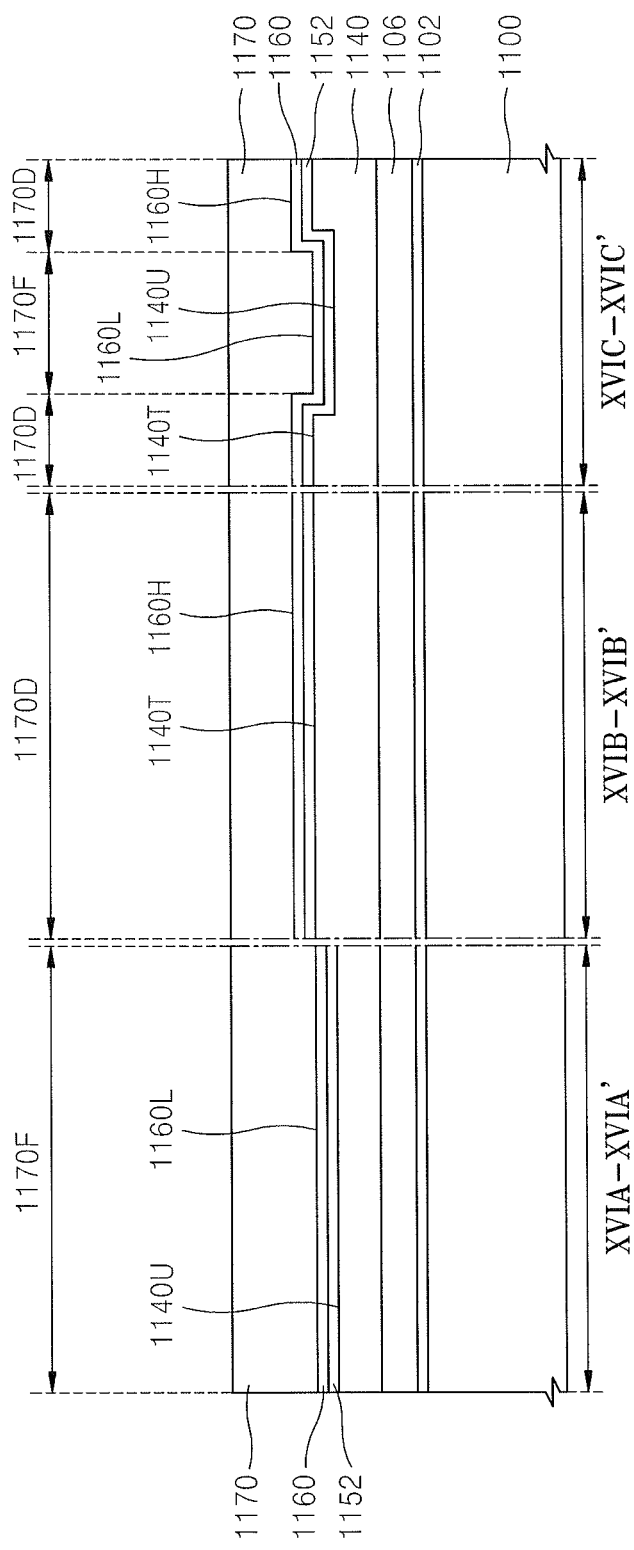

Referring to FIG. 16D, a photoresist film 1170 is formed on the organic anti-reflection film 1160 on which a floor level difference is formed due to a level difference between the first upper surface 1160L and the second upper surface 1160H. The photoresist film 1170 may include positive photoresist materials.

The photoresist film 1170 includes a first area 1170F disposed on the first upper surface 1160L of the organic anti-reflection film 1160 and a second area 1170D disposed on the second upper surface 1160H of the organic anti-reflection film 1160.

Figure 16E:
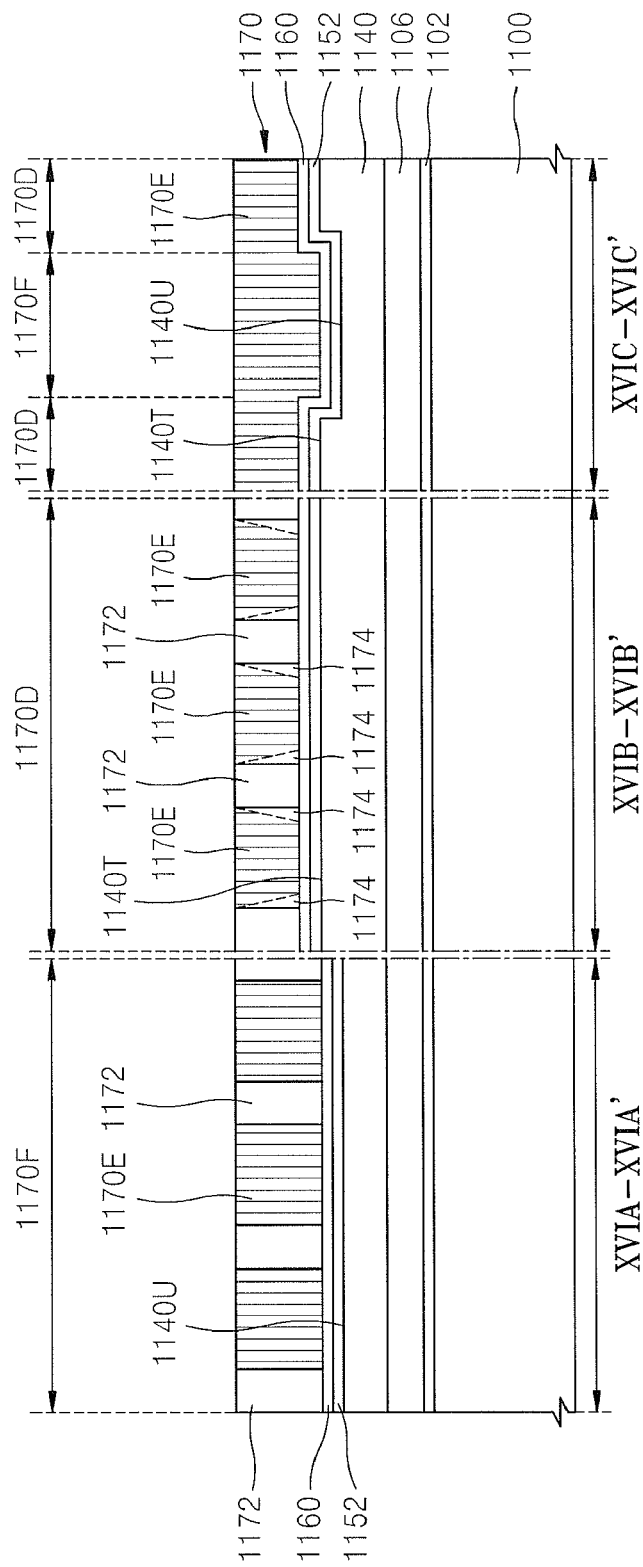

Referring to FIG. 16E, a partial area of the photoresist film 1170 is light-exposed using a photo mask having a predetermined light exposure pattern.

In light exposure of the photoresist film 1170, similarly as described with reference to FIG. 1F, there is applied a light exposure condition in which an optimal focused electron beam is eradiated on the first upper surface 1160L of the organic anti-reflection film 1160 and a defocused electron beam is eradiated on the second upper surface 1160H of the organic anti-reflection film 1160. To do this, an optimal focus position in light exposure of the photoresist film 1170 may be set to the first upper surface 1160L of the organic anti-reflection film 1160. By doing this, an optimal focused electron beam is eradiated on the first area 1170F of the photoresist film 1170, and a defocused electron beam is eradiated on the second area 1170D of the photoresist film 1170.

Figure 18:
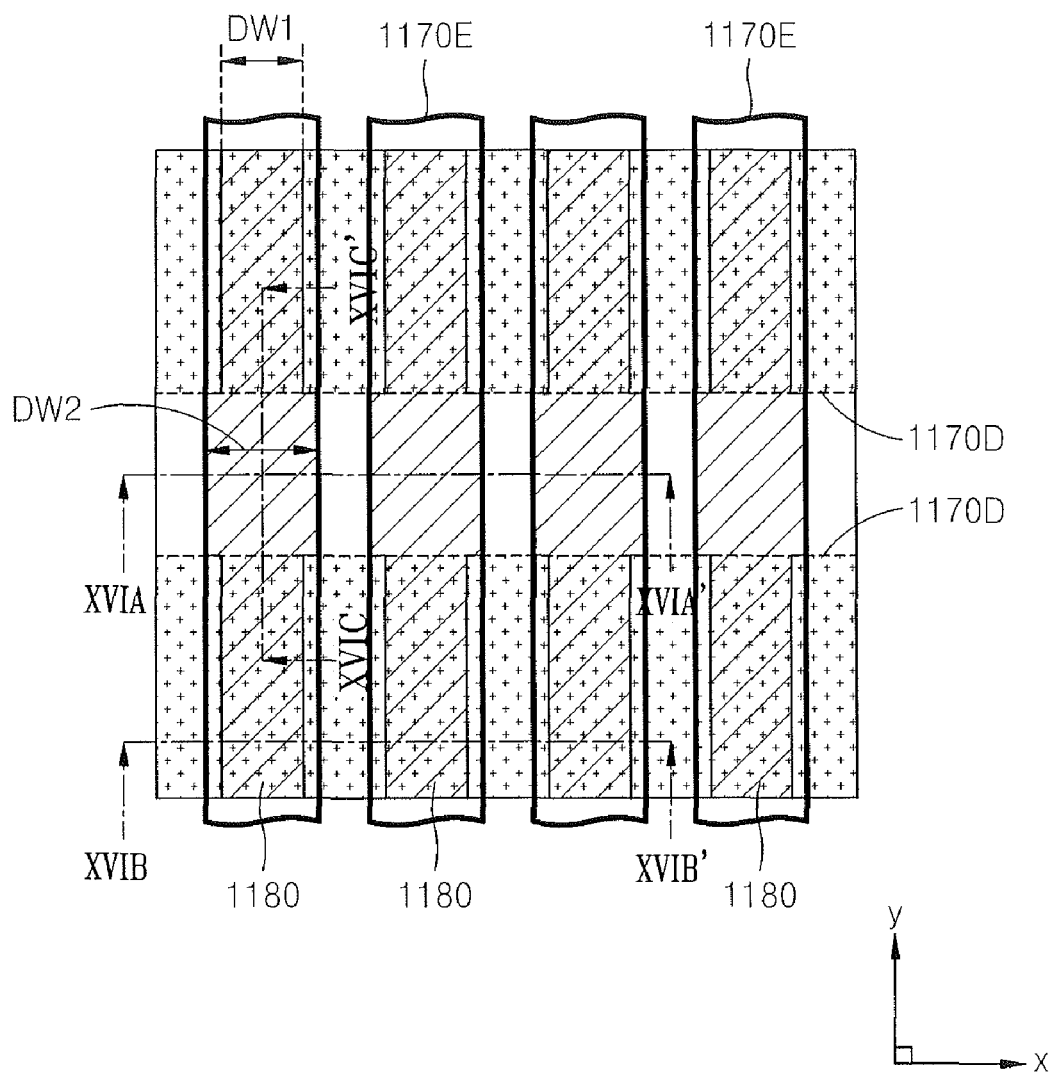
FIG. 18 is a layout illustrating a light exposure area of a photoresist film including an area on which an optimal focused electron beam is eradiated and an area on which a defocused electron beam is eradiated in light exposure in the method for forming a fine pattern according to the fifth exemplary embodiment of the inventive concept.

FIG. 18 is a layout illustrating light exposure areas 1170E of the photoresist film 1170 in the light exposure process described with reference to FIG. 16E.

Regarding the position of the light exposure areas 1170E of the photoresist film 1170, FIG. 18 shows that the light exposure areas 1170E of the photoresist film 1170 overlaps the layout of FIG. 15.

In FIG. 18, the second area 1170D disposed on the second upper surface 1160H of the organic anti-reflection film 1160 out of the photoresist film 1170 is shown together.

Referring to FIGS. 16E and 18, in the first area 1170F on which an optimal focused electron beam is eradiated out of the light exposure areas 1170E of the photoresist film 1170, the electron beam in light exposure is evenly eradiated up to the bottom of the photoresist film 1170 all over the light exposure areas 1170E. However, in the second area 1170D on which a defocused electron beam is eradiated out of the light exposure areas 1170E of the photoresist film 1170, the electron beam in light exposure is not evenly incident in the light exposure areas 1170E because of a relatively poor focus due to the eradiation of the defocused electron beam, and the closer from the top of the photoresist film 1170 to the bottom thereof, the more areas 1174 on which the electron beam is not eradiated in parts adjacent to non-light exposure areas 1172 exist. The areas 1174 on which the electron beam is not eradiated may be areas under slopes represented with dotted lines in FIG. 16E.

Figure 16F:
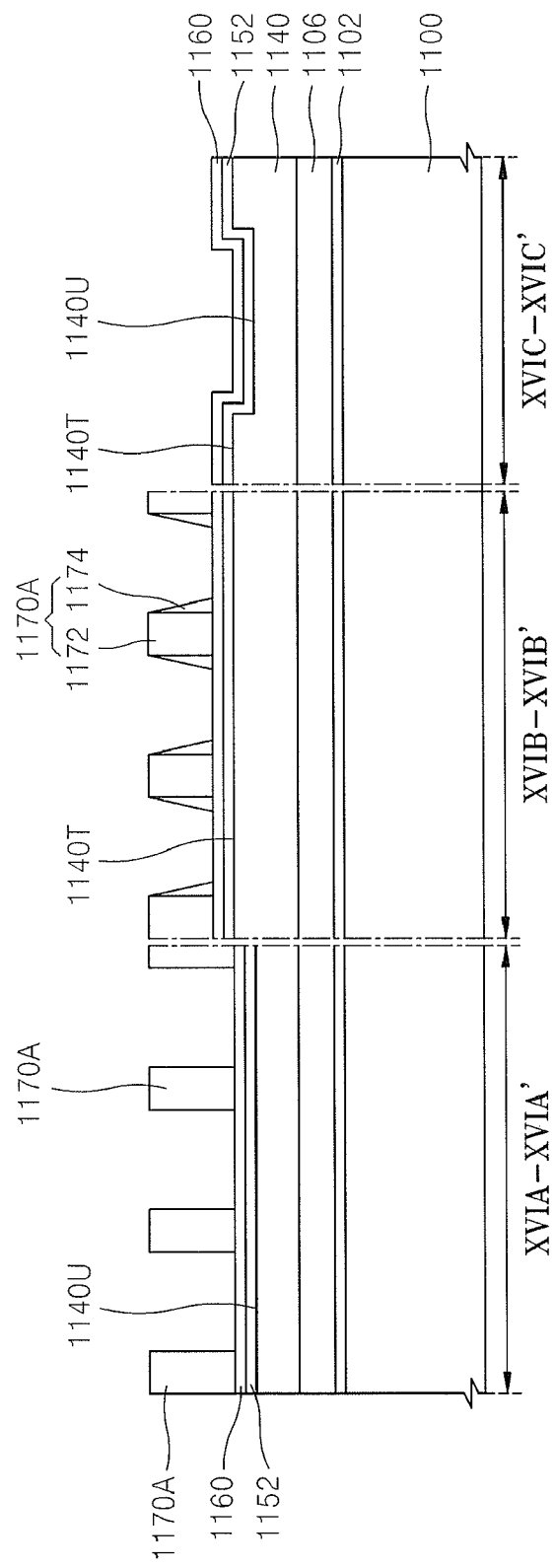

Referring to FIG. 16F, the light-exposed photoresist film 1170 is developed. As a result, areas on which the electron beam is eradiated are removed from the photoresist film 1170, and a plurality of photoresist patterns 1170A including the non-light exposure areas 1172 of the photoresist film 1170 and the areas 1174 on which the electron beam is not eradiated out of the light exposure areas 1170E remain on the organic anti-reflection film 1160.

Since the areas 1174 on which the electron beam is not eradiated, which remain in partial side walls of the non-light exposure areas 1172, are included in partial areas of the plurality of photoresist patterns 1170A, the plurality of photoresist patterns 870A have a form of lines, each extending to have a variable width in a length direction (y direction in FIG. 18).

Figure 19:
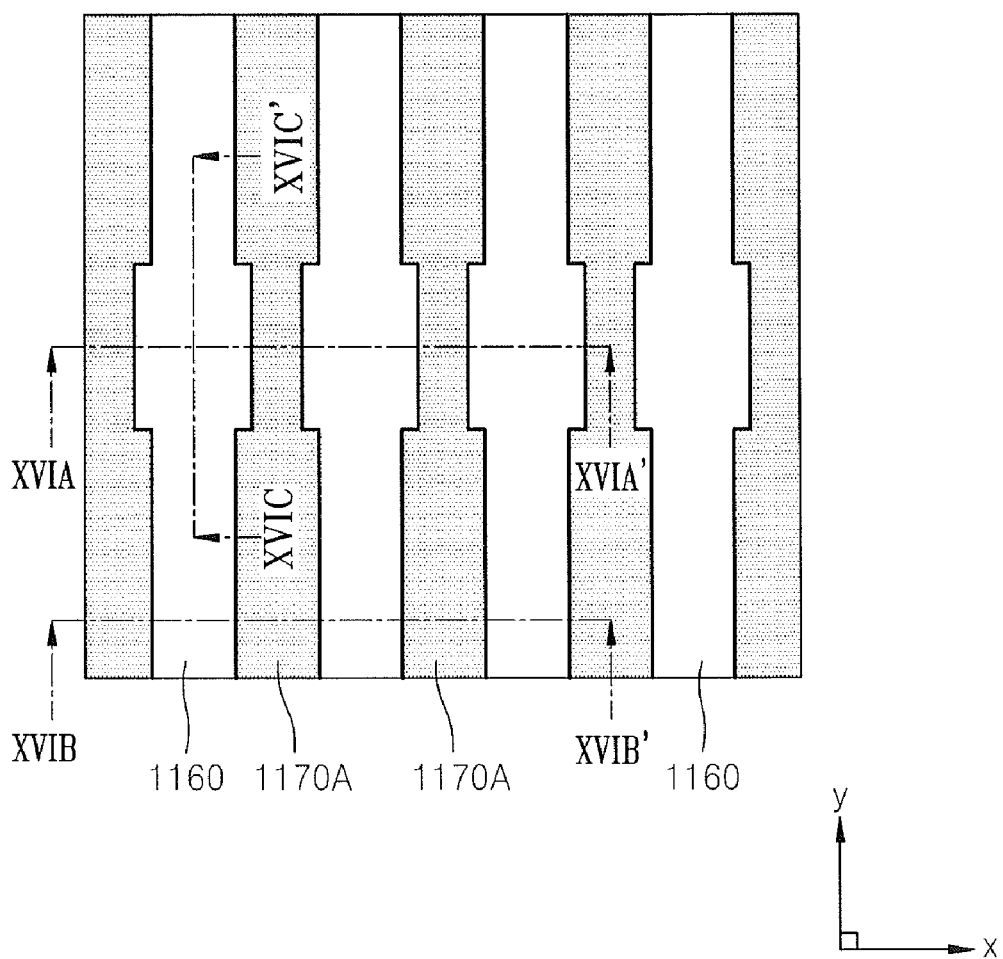
FIG. 19 is a top view of a result after a plurality of photoresist patterns are formed in the method for forming a fine pattern according to the fifth exemplary embodiment of the inventive concept.

FIG. 19 is a top view of a result after the plurality of photoresist patterns 1170A are formed.

In FIGS. 16F and 19, in the plurality of photoresist patterns 1170A, each part in which the areas 1174 on which the electron beam is not eradiated remain on the side walls of the non-light exposure areas 1172 has a width wider than that of each part in which only the non-light exposure areas 1172 exist.

Figure 16G:
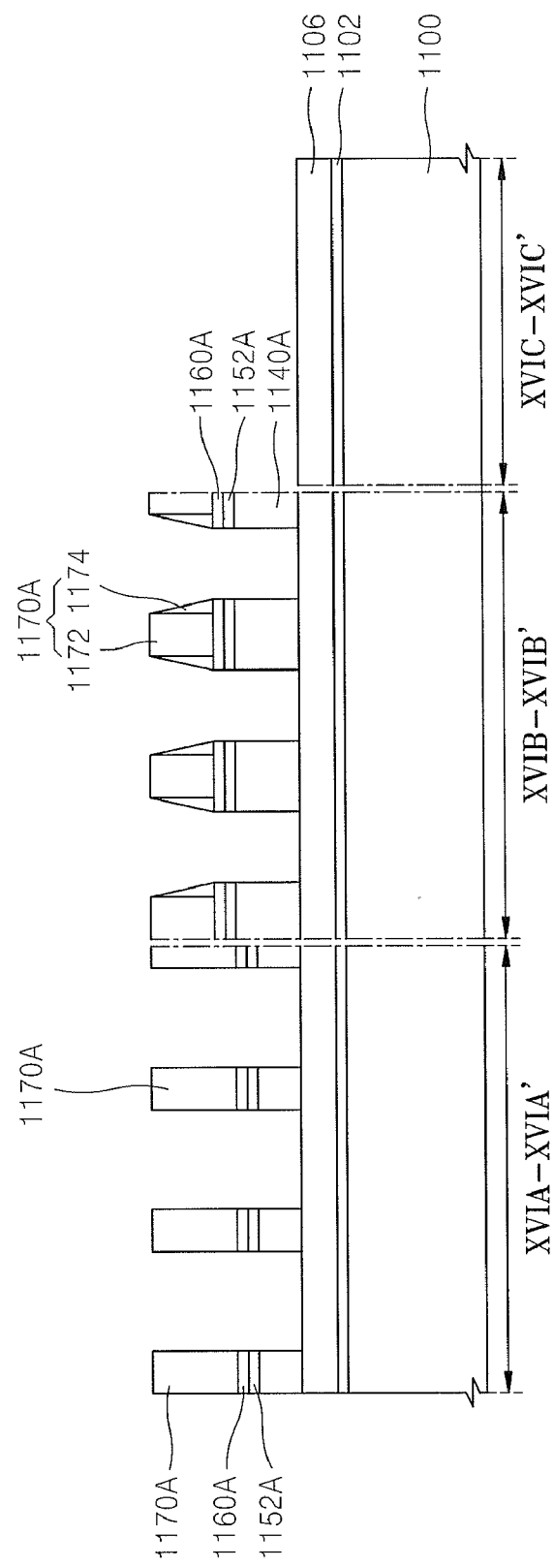

Referring to FIG. 16G, a hard mask pattern 1140A, an inorganic anti-reflection film pattern 1152A, and an organic anti-reflection film pattern 1160A are formed by etching the organic anti-reflection film 1160, the inorganic anti-reflection film 1152, and the hard mask layer 1140 in order using the plurality of photoresist patterns 1170A as an etching mask. While the hard mask pattern 1140A is being formed, at least a portion of the plurality of photoresist patterns 1170A may be attrited.

Referring to 16H, a plurality of mold patterns 1106A and a plurality of etching stop layer patterns 1102A are formed by etching the mold layer 1106 using the hard mask pattern 1140A as an etching mask and using the etching stop layer 1102 as an etching end point.

A first space S1 of the relatively narrow first width MW1 and a second space S2 of the relatively wide second width MW2 are formed between each two of the plurality of mold patterns 1106A, and an upper surface of the substrate 1100 is exposed through the first space S1 and the second space S2. The portion of the substrate 1100 exposed through the first space S1 and the second space S2 may be a conductive area included in the substrate 1100.

After the plurality of mold patterns 1106A are formed, residual layers of the hard mask pattern 1140A may remain on the plurality of mold patterns 1106A.

Referring to FIG. 16I, the plurality of wiring patterns 1180 are formed on the substrate 1100 by forming a conductive layer filling the first space S1 and the second space S2 between the plurality of mold patterns 1106A by means of the damascene process.

The plurality of wiring patterns 1180 have the planar structure shown in the layout of FIG. 15.

The plurality of wiring patterns 1180 have a form of lines, each extending to have a variable width in a length direction (y direction in FIG. 15). A portion having the relatively wide second width DW2 out of the plurality of wiring patterns 1180 is disposed under areas on which an optimal focused electron beam is eradiated on the substrate 1100. On the other hand, a portion having the relatively narrow first width DW1 out of the plurality of wiring patterns 1180 is disposed under areas on which a defocused electron beam is eradiated on the substrate 1100.

A detailed process for forming the plurality of wiring patterns 1180 by means of the damascene process will now be illustrated. A barrier film is formed on the inner walls of the first and second spaces S1 and S2 and the surface of the plurality of mold patterns 1106A. A metal film fully filling the first and second spaces S1 and S2 is formed on the barrier film. The barrier film is formed, for example, to prevent metal atoms of the metal film filling the first and second spaces S1 and S2 from diffusing other films surrounding the metal film. A process of forming the barrier film is not a requisite process in the inventive concept and may be omitted in some cases. The metal film may include any of Cu, W, and Al. For example, the metal film may include Cu having relatively low resistivity. In order to form the metal film, a Physical Vapor Deposition (PVD) process or an electroplating process may be used. Thereafter, by removing a portion of the metal film and a portion of the barrier film until upper surfaces of the plurality of mold patterns 1106A are exposed, the plurality of wiring patterns 1180 including the barrier film and the metal film are formed within the first space S1 and the second space S2 between the plurality of mold patterns 1106A.

Figure 16J:
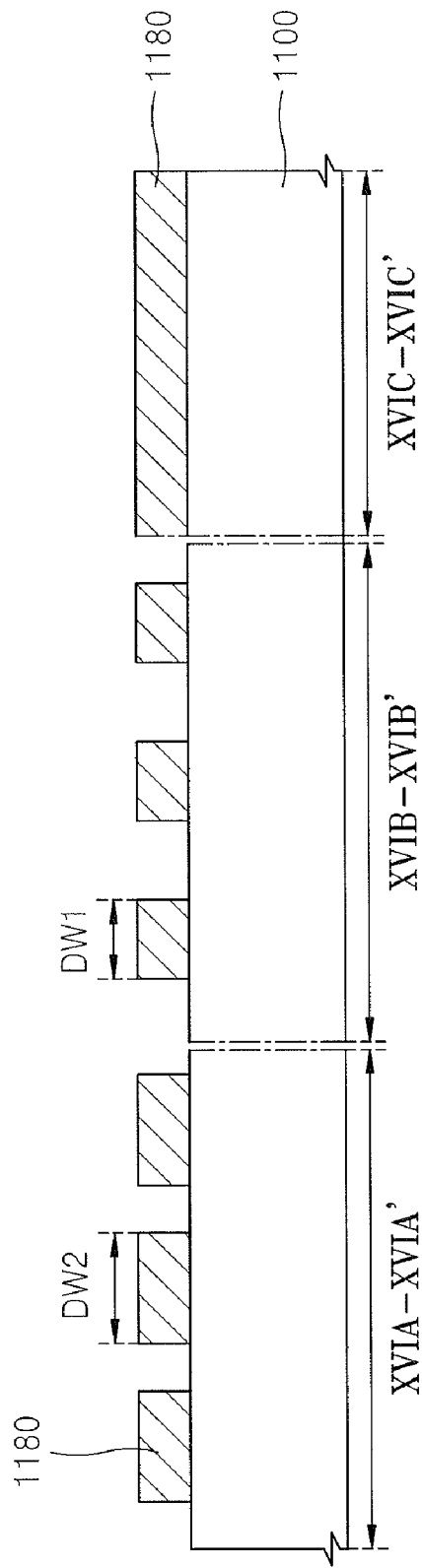

Referring to FIG. 16J, the plurality of mold patterns 1106A and the plurality of etching stop layer patterns 1102A are removed. In some cases, the process of FIG. 16J may be omitted.

In the method for forming a fine pattern according to the fifth exemplary embodiment of the inventive concept described with reference to FIGS. 15 to 19, in order to form the plurality of mold patterns 1106A needed to form the plurality of wiring patterns 1180 illustrated in FIG. 15 by means of the damascene process, there is used a method for providing a floor level difference on the upper surface of the organic anti-reflection film 1160 formed on the hard mask layer 1140 by etching a portion of the hard mask layer 1140 to form a floor level difference for eradiating a defocused electron beam onto the photoresist film 1170 in light exposure.

However, various changes and modifications may be performed within the scope of the inventive concept. For example, in order to form a level difference structure covered by the photoresist film 1170, instead of the method for forming a floor level difference by etching the hard mask layer 1140, a floor level difference for eradiating a defocused electron beam on an upper surface of the inorganic anti-reflection film 1152 may be created by etching a portion of the inorganic anti-reflection film 1152 formed on the hard mask layer 1140. Alternatively, if a process of forming the hard mask layer 1140 is omitted, a floor level difference for eradiating a defocused electron beam on an upper surface of the mold layer 1106 may be created by etching a portion of the mold layer 1106.

While the inventive concept has been particularly shown and described with reference to exemplary embodiments thereof, it will be understood that various changes in form and details may be made therein without departing from the spirit and scope of the following claims.

What is claimed is:

1. A method for forming a fine pattern, the method comprising:
    forming a first film on a substrate;
    forming a first film pattern including a first level area and a second level area having different distances from the substrate by changing a profile of an upper surface of the first film;
    forming a photoresist film having a first area covering the first level area and a second area covering the second level area;
    light-exposing the photoresist film under a light exposure condition, in which an optimal focused electron beam is eradiated on the first area and a defocused electron beam is eradiated on the second area, by using a photo mask having a light exposure pattern for simultaneously light-exposing the first area and the second area with the same width;
    forming a plurality of photoresist patterns continuously extending over the first level area and the second level area of the first film pattern with different widths on the first level area and the second level area by developing the light-exposed photoresist film; and
    forming a plurality of first fine patterns having different widths on the first level area and the second level area by etching the first film pattern using the plurality of photoresist patterns as an etching mask.

2. The method of claim 1, wherein the forming a first film pattern comprises:
    forming a mask pattern covering an upper surface of the first film;
    forming a recess part with a bottom surface having a level lower than that of the upper surface of the first film by etching a portion of the first film from the upper surface of the first film using the mask pattern as an etching mask; and
    exposing an upper surface of the first film pattern by removing the mask pattern.

3. The method of claim 2, wherein the bottom surface of the recess part is disposed in the first level area, and the upper surface of the first film pattern is disposed in the second level area.

4. The method of claim 2, wherein the bottom surface of the recess part is disposed in the second level area, and the upper surface of the first film pattern is disposed in the first level area.

5. The method of claim 1, further comprising forming a second film having an upper surface with a floor level difference on the first film pattern before forming the photoresist film and after forming the first film pattern, wherein the photoresist patterns is formed on the second film.

6. The method of claim 5, wherein the second film is a single film.

7. The method of claim 5, wherein the second film is a multiple film in which a plurality of films are layered in order.

8. The method of claim 1, wherein a plurality of first level areas are formed on the upper surface of the first film pattern, and the first level area has a planar structure of a form of a plurality of lines extending parallel to each other.

9. The method of claim 1, wherein a plurality of first level areas are formed on the upper surface of the first film pattern, and each of the plurality of first level areas has a planar structure of one of a circle, an ellipse, and a polygon.

10. The method of claim 1, wherein the substrate comprises a first member layer exposed on an upper surface thereof, and the method further comprises forming a first member pattern having a variable width in a length direction by etching the first member layer using the first fine pattern as an etching mask after forming the first fine pattern.

11. The method of claim 10, wherein the first member layer includes an insulation film or a conductive film.

* * * * *